United States Patent [19]

Tanaka et al.

[11] Patent Number: 4,665,494

[45] Date of Patent: May 12, 1987

[54] SPECTRUM DISPLAY DEVICE FOR AUDIO SIGNALS

[75] Inventors: Yoshiaki Tanaka, Fujisawa; Mamoru Inami, Yokohama; Zenju Otsuki, Tokyo, all of Japan

[73] Assignee: Victor Company of Japan, Limited, Japan

[21] Appl. No.: 562,183

[22] Filed: Dec. 16, 1983

[30] Foreign Application Priority Data

Dec. 17, 1982 [JP] Japan ............................ 57-221710
Dec. 22, 1982 [JP] Japan ............................ 57-225245
Dec. 25, 1982 [JP] Japan ............................ 57-231902

[51] Int. Cl.$^4$ .............................................. G01R 23/16
[52] U.S. Cl. .................................... 364/485; 364/724; 358/138; 340/347 SH; 324/77 B
[58] Field of Search ............... 364/483, 484, 485, 726, 364/724; 324/77 B, 77 E, 78 F; 358/138; 340/347 SH

[56] References Cited

U.S. PATENT DOCUMENTS

| | | | |
|---|---|---|---|
| 3,588,460 | 6/1971 | Smith ........................... | 364/726 |
| 3,634,760 | 1/1972 | Murtin et al. ............... | 364/726 |
| 3,662,161 | 5/1972 | Bergland et al. ........... | 364/726 |
| 3,706,843 | 12/1972 | Laub ........................... | 358/138 |
| 3,721,812 | 3/1973 | Schmidt ....................... | 364/726 |
| 4,054,785 | 10/1977 | Lehmann ..................... | 364/726 |
| 4,093,988 | 6/1978 | Scott ............................ | 364/726 |
| 4,188,583 | 2/1980 | McCurdy ................... | 340/347 SH |
| 4,222,077 | 9/1980 | Yamada ..................... | 340/347 SH |
| 4,264,958 | 4/1981 | Rowell, Jr. et al. ......... | 324/77 B |
| 4,321,680 | 3/1982 | Bertrand et al. ............ | 324/77 B |
| 4,346,268 | 8/1982 | Geerling ..................... | 179/107 R |
| 4,393,371 | 7/1983 | Morgan-Smith ............ | 340/347 SH |

FOREIGN PATENT DOCUMENTS 0056072 7/1982 European Pat. Off.

2020807 11/1979 United Kingdom.

OTHER PUBLICATIONS

Mesures, vol. 44, No. 3, Mar. 1979, pp. 61–73, Paris, FR; "l'Analyseur de Spectres: Un Outil Indispensable", p. 66, column 1, line 11,–column 2, line 33; FIG. 5.
Journal of Electronic Engineering, vol. 17, No. 164, Aug. 1980, pp. 54–56, Tokyo, JP; K. Shirakawa, "FFT Spectrum Analyzers Making Great Advances".

*Primary Examiner*—Gary Chin
*Attorney, Agent, or Firm*—Lowe, Price, LeBlanc, Becker & Shur

[57] ABSTRACT

An input audio signal is AD converted into digital signals which are processed by a central processing unit (CPU) in which Fast Fourier Transform (FFT) operation and power spectrum calculation are effected. As a result power spectrum data is obtained, and then position determination is effected to determine the position of each bar of a bar graph to be displayed on a display unit screen, according to the power level at different frequencies within the spectrum of the audio signal. Pattern data is then produced in correspondence with the determined position, and output data from the CPU is fed via a video display processor to a video RAM, thereby displaying the spectrum by way of a predetermined pattern of a bar graph on the screen. In order to reduce the number of digital data used in FFT operation the input audio signal may be divided into a plurality of different frequency bands so that different sampling frequencies are used for AD conversion of signals of respective bands. As a result, operating time is reduced. To further reduce the operating time the CPU may be arranged to execute parallel operations in various manners. Furthermore, two or more CPUs may be employed to further increase the operating speed.

23 Claims, 18 Drawing Figures

FIG. 3

|  | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|----|----|----|----|----|----|----|----|----|----|----|----|----|----|----|----|----|----|----|----|----|----|
| 0 | 0 |  |  |  |  |  |  |  |  |  |    |    |    |    |    |    |    |    |    |    |    |    |    |    |    |    |    |    |    |    |    |    |
| 1 | 32 | 33 | 34 | 35 | 36 | 37 | 38 |  |  |  |  |  |  |  |  |  |  |  |  |  |  |  |  |  | 56 | 57 | 58 | 59 | 60 | 61 | 62 | 63 |
| 2 | 64 | 65 | 66 | 67 | 68 | 69 |  |  |  |  |  |  |  |  |  |  |  |  |  |  |  |  |  |  |  | 90 | 91 | 92 | 93 | 94 | 95 |
| 3 | 96 | 97 | 98 | 99 | 100 |  |  |  |  |  |  |  |  |  |  |  |  |  |  |  |  |  |  |  |  |  |  |  | 125 | 126 | 127 |
| 4 | 128 | 129 | 130 | 131 |  |  |  |  |  |  |  |  |  |  |  |  |  |  |  |  |  |  |  |  |  |  |  |  |  | 158 | 159 |
| 5 | 160 | 161 | 162 |  |  |  |  |  |  |  |  |  |  |  |  |  |  |  |  |  |  |  |  |  |  |  |  |  |  |  | 190 | 191 |
| 6 | 192 | 193 |  |  |  |  |  |  |  |  |  |  |  |  |  |  |  |  |  |  |  |  |  |  |  |  |  |  |  |  | 222 | 223 |
| 7 | 224 | 225 |  |  |  |  |  |  |  |  |  |  |  |  |  |  |  |  |  |  |  |  |  |  |  |  |  |  |  |  | 254 | 255 |
| 8 | 257 |  |  |  |  |  |  |  |  |  |  |  |  |  |  |  |  |  | 274 |  |  |  |  |  |  |  |  |  |  |  | 286 | 287 |
| 9 | 288 | 289 |  |  |  |  |  |  |  |  |  | 205 |  |  |  |  |  |  |  |  |  |  |  |  |  |  |  |  |  |  | 318 | 319 |
| 10 | 320 | 321 |  |  |  |  |  |  |  |  |  |  |  |  |  |  |  |  |  |  |  |  |  |  |  |  |  |  |  |  | 350 | 351 |
| 11 | 352 | 353 |  |  |  |  |  |  |  |  |  |  |  |  | 366 | 367 | 368 |  |  |  |  |  |  |  |  |  |  |  |  |  | 382 | 383 |
| 12 | 384 | 385 |  |  |  |  |  |  |  |  |  |  |  |  |  | 399 | 400 | 401 |  |  |  |  |  |  |  |  |  |  |  |  | 414 | 415 |
| 13 | 416 | 417 |  |  |  |  |  |  |  |  |  |  |  |  |  |  | 432 | 433 | 434 |  |  |  |  |  |  |  |  |  |  |  | 446 | 447 |
| 14 | 448 | 449 |  |  |  |  |  |  |  |  |  |  |  |  |  |  |  |  |  |  |  |  |  |  |  |  |  |  |  |  | 478 | 479 |
| 15 | 480 | 481 |  |  |  |  |  |  |  |  |  |  |  |  |  |  |  |  |  |  |  |  |  |  |  |  |  |  |  |  | 510 | 511 |
| 16 | 512 | 513 |  |  |  |  |  |  |  | 521 |  |  |  |  |  |  |  |  |  |  |  |  |  |  |  |  |  |  |  |  | 542 | 543 |
| 17 | 544 | 545 | 546 |  |  |  |  |  |  |  |  |  |  |  |  |  |  |  |  |  |  |  |  |  |  |  |  |  |  |  | 574 | 575 |
| 18 | 576 | 577 | 578 | 579 |  |  |  |  |  |  |  |  |  |  |  |  |  |  |  |  |  | 598 |  |  |  |  |  |  |  |  | 606 | 607 |
| 19 | 608 | 609 | 610 | 611 | 612 |  |  |  |  |  | 619 |  |  |  |  |  |  |  |  |  |  |  |  |  |  |  |  |  |  |  | 638 | 639 |
| 20 | 640 | 641 | 642 | 643 | 644 | 645 |  |  |  |  |  |  |  |  |  |  |  |  |  |  |  |  |  |  |  |  |  |  |  |  | 670 | 671 |
| 21 | 672 | 673 | 674 | 675 | 676 | 677 | 678 | 679 |  |  |  |  |  |  |  |  |  |  |  |  |  |  |  |  |  |  |  |  | 698 | 699 | 702 | 703 |
| 22 | 704 | 705 | 706 | 707 | 708 | 709 | 710 | 711 | 712 |  |  |  |  |  |  |  |  |  |  |  |  |  |  |  |  |  |  |  | 729 | 730 | 731 | 732 | 733 | 734 | 735 |
| 23 | 736 | 737 | 738 | 739 | 740 | 741 | 742 | 743 | 744 |  |  |  |  |  |  |  |  |  |  |  |  |  |  |  | 760 | 761 | 762 | 763 | 764 | 765 | 766 | 767 |

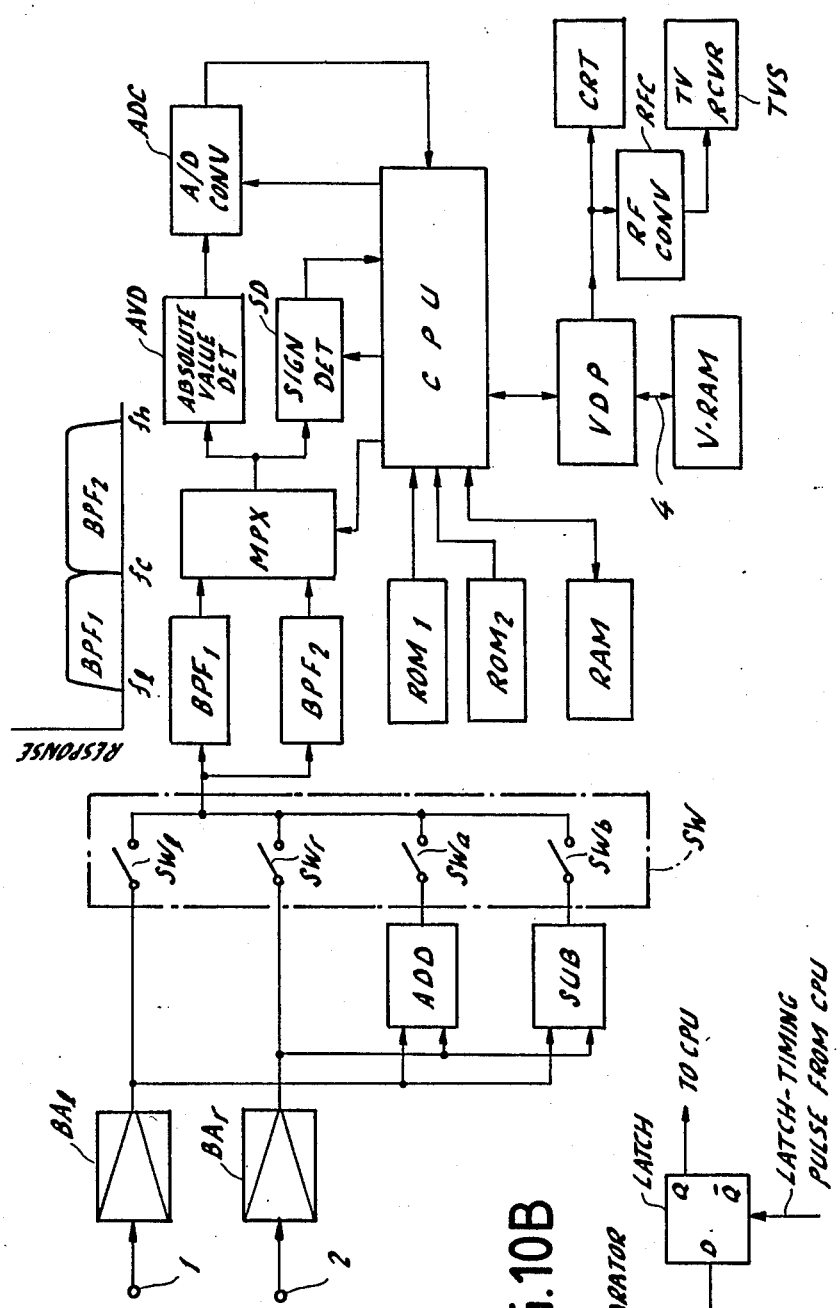
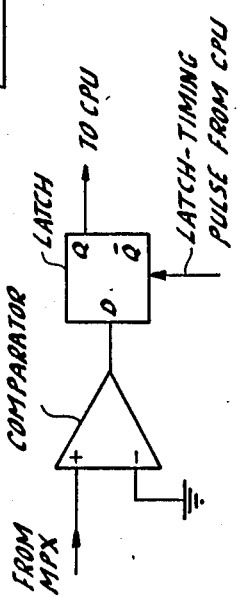
FIG.10A
FIG.10B

FIG.13A
FIG.13B
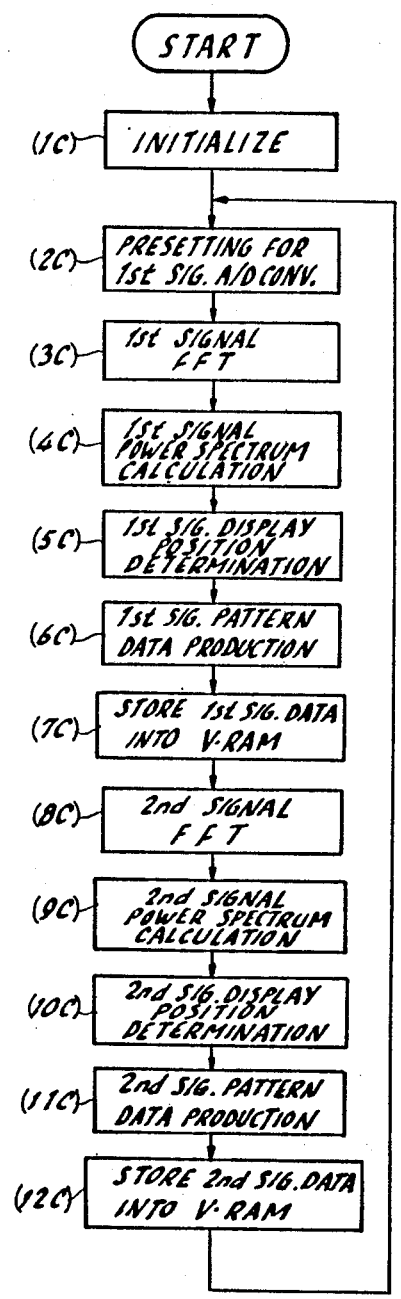
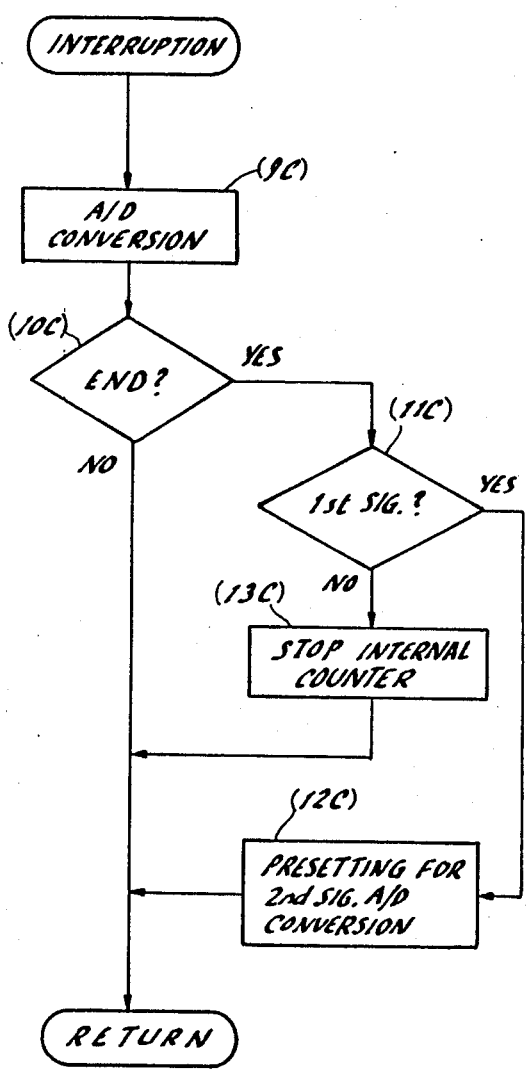

SPECTRUM DISPLAY DEVICE FOR AUDIO SIGNALS

BACKGROUND OF THE INVENTION

This invention relates to a spectrum display device and method for audio signals, which is capable of displaying a spectrum of an audio signal on a screen of a display unit at real time, and to an analog to digital converter having plural sampling frequencies, each of which is selected as a function of the highest audio frequency applied to the converter.

Since a display device capable of displaying a spectrum of an audio signal on a screen of a display unit at real time can be effectively used for visual confirmation of vividness, adjustment of balance between signals of respective channels within audio devices, and for adjustment of various characteristics of audio devices, research for practical use of display devices of this sort has been carried out hitherto.

As spectrum display devices for audio signals in the prior art, although it has been attempted to provide one having a structure arranged to obtain frequency components of an audio signal by way of a plurality of band pass filters so as to indicate the same on a screen of a display unit, such conventional one is complex in structure, while it has been difficult to provide one having a high resolution at a low cost. For this reason an improvement therefor has been desired.

In order to resolve the above-mentioned problem although effort has been made to provide a new spectrum display device in which spectrum analysis is carried out by way of Fast Fourier Transform (FFT) operation to display the result of the same on a screen of a display unit, it is necessary to execute complex calculations in connection with a number of data when performing FFT operation when it is intended to narrow the interval between frequencies of the spectrum on spectrum analysis, and therefore it takes a long period of time for performing FFT operation resulting in difficulty in real time indication of a spectrum.

SUMMARY OF THE INVENTION

The present invention has been developed in order to remove the above-described drawbacks inherent to the conventional spectrum display device.

It is, therefore, an object of the present invention to provide a new and useful spectrum display device which is capable of indicating a spectrum of an audio signal with a desired frequency interval at substantially real time.

According to a feature of the present invention, an input audio signal is AD converted, and then digital signals resulted from AD conversion are processed by way of FFT operations and power spectrum calculations executed by one or more central processing units to determine levels at a plurality of frequencies within a spectrum of the audio signal, which levels are used to determine position of respective display elements, such as bars of a bar graph used as a display pattern to be indicated on a display unit screen, and data from the central processing unit is transmitted via a video display processor into a video ram.

According to another feature of the present invention the entire frequency range of an input audio signal is divided into a plurality of frequency bands first, and then calculations for obtaining spectrum data are executed for respective band signals in different manners. As a result, the number of digital data necessary for Fast Fourier Transform operation is effectively reduced, resulting in reduction in operating time.

According to further feature of the present invention, the central processing unit is arranged to execute parallel operations in various manners thereby increasing the operating speed.

In accordance with the present invention there is provided a spectrum display device for audio signals comprising: analog-to-digital converting means for converting an input analog signal into digital signals at a sampling frequency; a central processing unit for effecting FFT operation in connection with the digital signals outputted from the analog-to-digital converting means, for effecting power spectrum calculation in connection with the result of the FFT operation to obtain power spectrum data, for converting the power spectrum data into pattern information corresponding to levels at a plurality of frequencies within a spectrum of the input analog signal, and for outputting data indicative of the pattern information; and a video display processor supplied with the output data from the central processing unit thereby displaying a power spectrum by way of the pattern on a screen of a display unit such that levels at the plurality of frequencies with the spectrum are arranged in sequence.

In accordance with the present invention there is also provided a spectrum display device for audio signals comprising: band-separating means for dividing an input audio signal into signals of a plurality of frequency bands; a plurality of analog-to-digital converting means for respectively simultaneously converting a plurality of output signals from the band-separating means into digital signals at different sampling frequencies; a central processing unit for effecting FFT operation in connection with the digital signals outputted from the plurality of analog-to-digital converting means, for effecting power sepctrum calculation in connection with the result of the FFT operation to obtain power spectrum data, for converting the power spectrum data into pattern information corresponding to levels at a plurality of frequencies within a spectrum of the input analog signal, and for outputting data indicative of the pattern information; and a video display processor supplied with the output data from the central processing unit thereby displaying a power spectrum by way of the pattern on a screen of a display unit such that levels at the plurality of frequencies with the spectrum are arranged in sequence.

In accordance with the present invention there is also provided a spectrum display device for audio signals comprising: band-separating means for dividing an input audio signal into signals of a plurality of frequency bands; analog-to-digital converting means for respectively converting a plurality of output signals from the band-separating means into digital signals at different sampling frequencies; a plurality of central processing units for effecting FFT operation in connection with the digital signals outputted from the analog-to-digital converting means, for effecting power spectrum calculation in connection with the result of the FFT operation to obtain power spectrum data, for converting the power spectrum data into pattern information corresponding to levels at a plurality of frequencies within a spectrum of the input analog signal, and for outputting data indicative of the pattern information, one of the centeral processing units being arranged to effect FFT operation and power spectrum calculation in connection with the digital signal of a predetermined frequency band among the plurality of frequency bands; and a video display processor supplied with the output data from the central processing unit thereby displaying a power spectrum by way of the pattern on a screen of a display unit such that levels at the plurality of frequencies with the spectrum are arranged in sequence.

In accordance with the present invention there is further provided a spectrum display device for audio signals comprising: band-separating means for dividing an input audio signal into signals of a plurality of frequency bands; a plurality of analog-to-digital converting means for respectively simultaneously converting a plurality of output signals from the band-separating means into digital signals at different sampling frequencies; a plurality of central processing units for effecting FFT operation in connection with the digital signals outputted from the plurality of analog-to-digital converting means, for effecting power spectrum calculation in connection with the result of the FFT operation to obtain power spectrum data, for converting the power spectrum data into pattern information corresponding to levels at a plurality of frequencies within a spectrum of the input analog signal, and for outputting data indicative of the pattern information, one of the centeral processing units being arranged to effect FFT operation and power spectrum calculation in connection with the digital signal of a predetermined frequency band among the plurality of frequency bands; and a video display processor supplied with the output data from the central processing unit thereby displaying a power spectrum by way of the pattern on a screen of a display unit such that levels at the plurality of frequencies with the spectrum are arranged in sequence.

In accordance with a further aspect of the invention there is provided apparatus for processing an analog signal having a predetermined frequency range and converting said analog signal into plural digital signals wherein each of said digital signals represents the amplitude of the analog signal in each of plural different bands in the predetermined frequency range, each of which has a maximum frequency. The apparatus comprises means responsive to the analog signal for separating it into the plural different bands whereby plural further analog signals, one for each of the bands, are derived. Each of the plural further analog signals is converted into a separate digital signal by a mean having a different sampling frequency associated with each of the plural further analog signals. Each of the different sampling frequencies for each of the plural further analog signals is arranged so that the sampling frequency increases with increasing maximum frequencies associated with each band. Digital signal processing means processes the separate digital signals derived by the converting means.

BRIEF DESCRIPTION OF THE DRAWINGS

The object and features of the present invention will become more readily apparent from the following detailed description of the preferred embodiments taken in conjunction with the accompanying drawings in which:

FIG. 3 is an explanatory diagram of sections on a display unit screen of the spectrum display device of FIG. 1;

FIG. 10A is a schematic block diagram of a third embodiment of the spectrum display device according to the present invention;

FIG. 10B is a diagram showing a sign detector used in the embodiment of FIG. 10A;

FIGS. 13A and 13B are flow charts showing another operation of the central processing unit used in the embodiment of FIG. 10A.

The same or corresponding elements and parts are designated at like reference numerals throughout the drawings.

DETAILED DESCRIPTION OF THE INVENTION

Figure 1:
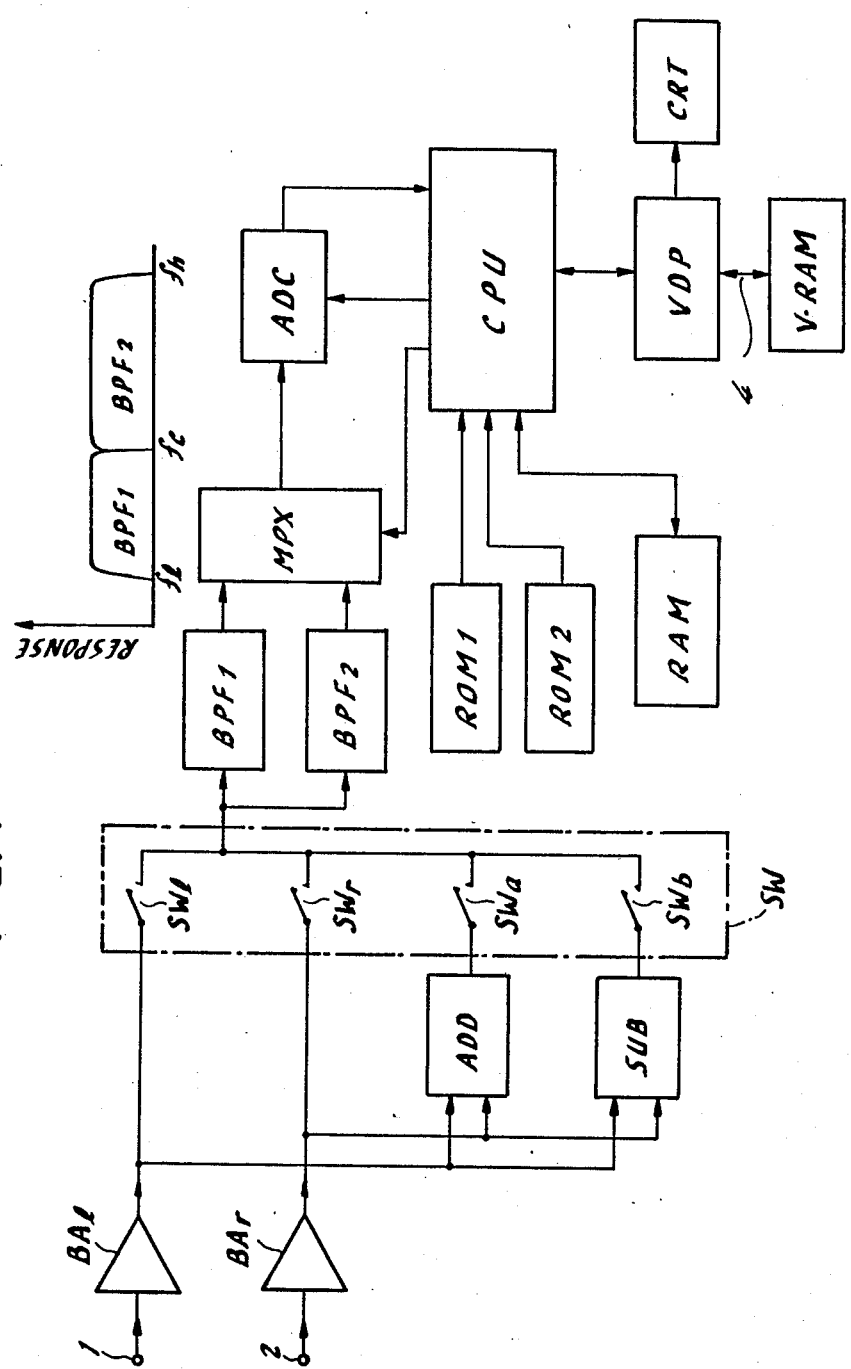
FIG. 1 is a schematic block diagram of a first embodiment of the spectrum display device according to the present invention.

Referring to FIG. 1 a block diagram of an embodiment of the spectrum display device for audio signals according to the present invention is shown. In FIG. 1, the reference 1 is an input terminal of left channel (channel L), and the reference 2 is an input terminal of right channel (channel R). The channel L signal is applied to a switch SWl, an adder ADD and a subtractor SUB after being amplified by a buffer amplifier BAl, while the channel R signal is applied to a switch SWr, the adder ADD and the subtractor SUB after being amplified by another buffer amplifier BAr.

The adder ADD produces a sum signal of the channel L signal and the channel R signal to apply the sum signal to a switch SWa, while the subtractor SUB produces a difference signal between the channel L signal and the channel R signal to apply the difference signal to a switch SWb.

The reference SW shown by dot-dash lines in FIG. 1 is a selection switch comprising the above-mentioned individual switches SWl, SWr, SWa and SWb, and the selection switch SW is arranged such that when one of the individual switches thereof is in ON state, remaining switches are all in OFF state so that one of signals selected by the single switch, which is in ON state, is applied to a subsequent circuit.

In the illustrated example, one of four signals, i.e. the channel L signal, channel R signal, the sum signal of the channel L signal and the channel R signal, and the difference signal between the channel L signal and the channel R signal, is selected by the selection switch SW.

A signal selected by the above-mentioned selection switch SW is applied to band pass filters BPF1 and BPF2, and respective output signals from the respective band pass filters BPF1 and BPF2 are applied via a multiplexer MPX to an analog-to-digital converter ADC (hereinafter analog-to-digital conversion will be simply referred to as AD conversion).

An output signal from the band pass filter BPF1 is referred to as a first signal which is within a frequency band ranging from a frequency fl to a frequency fc, while an output signal from the band pass filter BPF2 is referred to as a second signal which is within a frequency band ranging from a frequency fc to a frequency fh. The multiplexer MPX sends the above-mentioned first and second signals in sequence along time base in accordance with a switching control signal from a central processing unit CPU whose operation is described in detail infra.

Although two band pass filters BPF1 and BPF2 are employed as described in the above in the example illustrated in FIG. 1 so that the signal to be an objective of spectrum analysis, which signal is in a frequency band fl to fh, can be divided into two halves at the frequency fc, when practicing the present invention, three or more band pass filters, which divide a frequency band ranging from a frequency fl to a frequency fh, may be used.

In the spectrum display device for audio signals according to the present invention, spectrum analysis of an audio signal is effected by way of Fast Fourier Transform, which will be simply referred to as FFT operation hereinafter, and power spectrum calculation as will be described later. In the above, FFT operation is an algorithm for the machine calculation of complex Fourier Series established by Cooley and Tukey and described in MATHEMATICS OF COMPUTATION, page 297, published April 1965. When a signal having a frequency band ranging from fl to fh is subjected to spectrum analysis, it is required that digital data use for FFT operation of variations having a signal component having a frequency of fh should be obtained through AD conversion performed with a sampling frequency of at least 2fh. Furthermore, a number of digital data is needed to effect spectrum analysis whose resolution is sufficient in connection with a signal component close to fl.

Taking an example of spectrum analysis of a signal whose fl is 25 Hz and fh is 20 KHz, i.e. a signal having a frequency range between 25 Hz and 20 KHz, which analysis is performed by way of FFT operation, the digital signal necessary for FFT operation is a signal which is obtained by AD conversion effected by an AD converter with a sampling frequency equal to or higher than 40 KHz, and assuming that the resolution of the spectrum analysis is 25 Hz, the number of data necessary for FFT operation is 40000/25=1600.

Since FFT operation takes a shorter time as the number of digital data decrease, it is desirable for the number of digital data used in the FFT operation to be small in order to display the spectrum of an audio signal at real time.

However, when the number of digital data used for FFT operation is small, a frequency interval of the spectrum resulted from the FFT operation becomes long, providing unsatisfactroy result of analysis in connection with low frequency range. Therefore, it is necessary to increase the number of digital data used for FFT operation to an extent that a satisfactory analysis result analysis is obtained in connection with at least low frequency range. Such an increase in digital data number causes the FFT operation to take longer time, and therefore such an increase is apt to be an obstacle for real time display of spectrum.

To remove such a problem therefore, in the spectrum display device according to the present invention a frequency band fl to fh subjected to spectrum display, is divided into a plurality of signals by way of a plurality of band pass filters so that a separate FFT operation is executed for each signal of the respective frequency bands resulting from the division. As a result, spectrum analysis having the desired resolution is performed in less time with fewer digital data.

One of the circumstances in which audio signals are treated involves determining the amplitude of the signal in various frequency intervals of the signal relative to an octave (for instance, interval of 1 octave, ½ octave, ⅓ octave, ⅔ octave or the like). When the signal amplitude is indicated, frequency is indicated on a logarithmic scale. When a spectrum analysis is performed only over a low frequency range of an entire range of frequencies which are the objective of spectrum display, some useless data are calculated in connection with a high frequency range. Therefore, in the present invention, the frequency band fl to fh subjected to spectrum analysis is divided into a plural bands to obtain necessary high speed data.

In the embodiment shown in FIG. 1, band pass filters BPF1 and BPF2 divide the signal of the frequency range fl to fh, which is to be an objective of spectrum analysis, into a first frequency band fl to fc and a second frequency band fc to fh as described above. Then sampling/quantization is effected in connection with the above-mentioned first and second signals with different sampling frequencies so as to obtain a predetermined number of digital data.

Assume that the frequencies fl and fh are 25 Hz and 20 KHz as in the above-described example and that the frequency fc is 1.6 KHz, a signal in a frequency band between 25 Hz and 1.6 KHz is the first signal, while a signal in a frequency band between 1.6 KHz and 20 KHz is the second signal.

In the embodiment device shown in FIG. 1, the first and second signals are fed to analog to digital converter ADC in sequence by way of the multiplexer MPX to be converted into digital signal; switching control timing of the multiplexer MPX and start timing of the conversion by the AD converter ADC are both determined by the central processing unit CPU.

The central processing unit CPU controls converter ADC so it converts the first analog signal into a digital signal with a sampling frequency of 2fc while the first signal is applied via the multiplexer MPX to converter ADC by the control of the central processing unit CPU; converter ADC converts the second analog signal into a digital signal with a sampling frequency of 2fh while the second signal is applied via the multiplexer MPX to the converter ADC by the control of the central processing unit CPU.

When the first signal is between 25 Hz and 1.6 KHz, and the second signal is between 1.6 KHz and 20 KHz, analog to digital conversion of the first and second signals are respectively effected with sampling frequencies of 3.2 KHz and 40 KHz. Digital signals obtained by the above-mentioned analog to digital conversion are stored in a main memory RAM as data to be used for FFT operation, where the number of digital data necessary for FFT operation depends on the frequency interval of the spectrum which is to be obtained by FFT operation. For instance, when it is intended to obtain a spectrum analysis with a frequency interval of 25 Hz in connection with the first signal, the number of analog to digital converted digital data to be prepared is 3200/25=128. Similarly, assuming that the number of digital data in connection with the second signal is 128, the result of spectrum analysis is such that the frequency interval is 40000/128=312.5 (Hz).

The number of digital data in connection with each of the first and second signals may be arbitrarily determined depending on a frequency interval desired for a result of spectrum analysis, wherein the number of digital data for the first signal is not required to be equal to that for the second signal.

Figure 4:
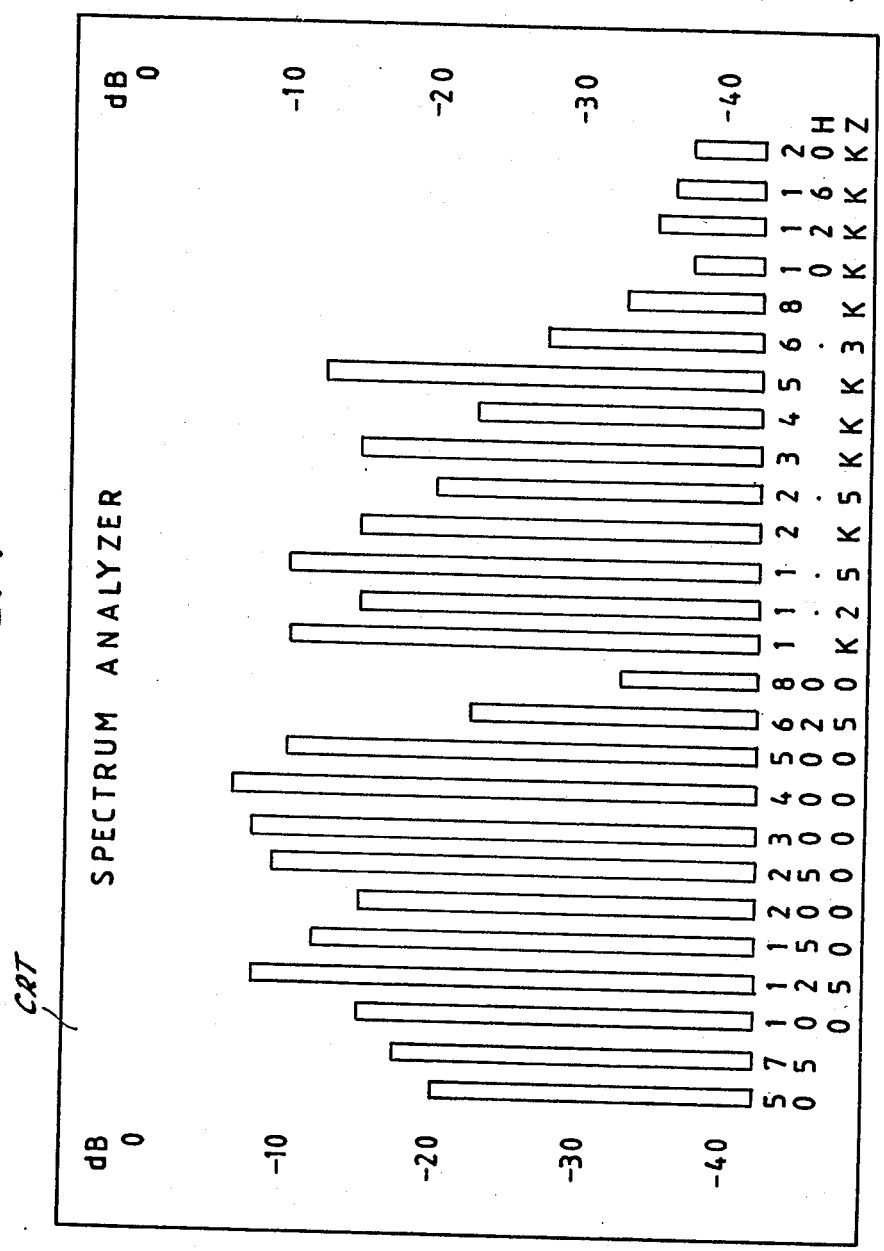
FIG. 4 is a diagram showing an example of a display pattern on the display unit screen.

The central processing unit CPU performs predetermined control operations and calculations in accordance with a program stored in a read-only memory ROM1, and also sends data via a video display processor VDP to a video read only memory. The RAM is a main memory, and ROM2 is a high-speed memory in which a program for spectrum analysis is prestored. Furthermore, CRT is a display unit, where the display unit is of the type using a cathode ray tube in the following description. On a screen of the display unit CRT is indicated the result of spectrum analysis as shown in FIG. 4 for instance.

The video display processor VDP functions as an interface between the video RAM connected thereto via a data bus 4, and the central processing unit CPU, and is constructed such that it is capable of determining the contents of pictures by using various data stored in the above-mentioned video RAM, and of generating a composite video signal of a predetermined standard system. This video display processor VDP, for instance, may be one manufactured by Texan Instruments, Inc., of the United States, introduced in ELECTRONICS, Nov. 20, 1980 (pages 123-126) or an integral composite video generator disclosed in U.S. Pat. No. 4,263,302 issued to Texas Instruments, and it is assumed that the above-mentioned video display processor is used in the following description.

In FIG. 1, although no address-decoder is shown, in actual structure an address-decoder responsive to address data from the central processing unit CPU is provided so as to respectively designate the addresses of the main memory RAM, read-only memories ROM1 and ROM2, AD converter ADC, multiplexer MPX, and the video display processor VDP. The central processing unit CPU is preferably of high-speed and capable of commanding signed multiplication, which is a basic calculation for FFT. As the central processing unit CPU may be used an integrated circuit TMS9995 manufactured by Texas Instruments.

Figure 2:
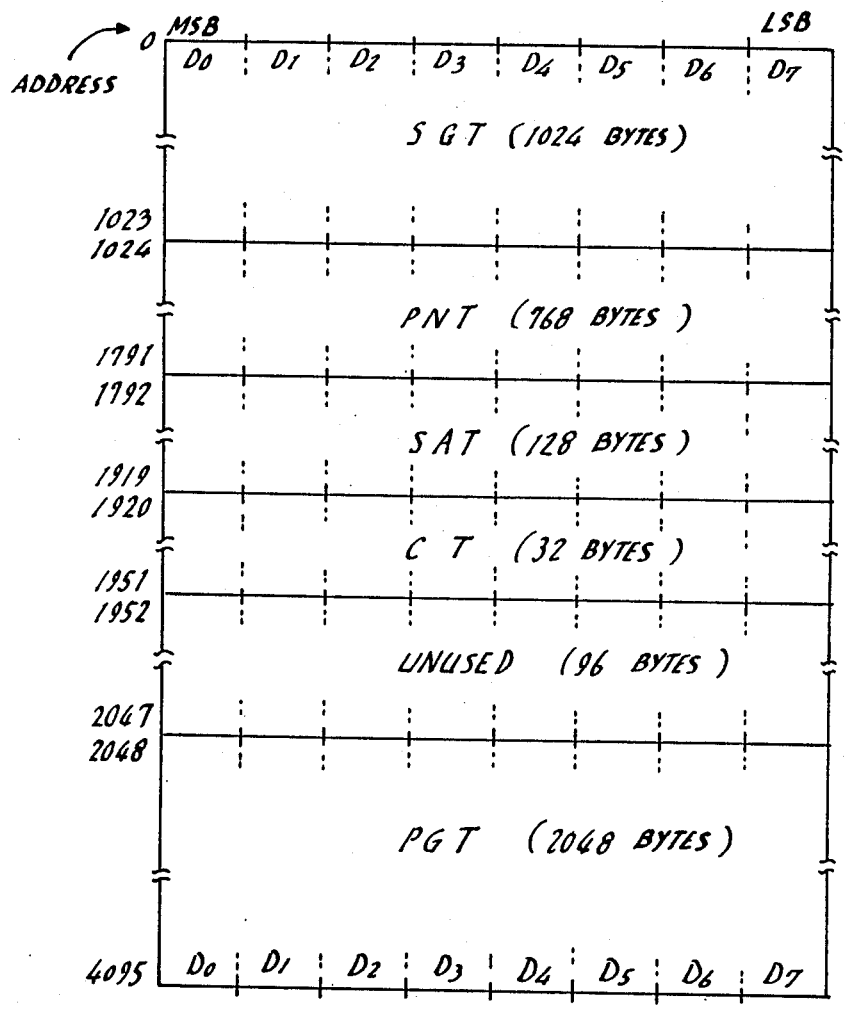
FIG. 2 is an example of a memory map of a video RAM used in the embodiment of FIG. 1.

FIG. 2 is a drawing showing an example of a memory map of the video RAM connected via the bus 4 to the video display processor. In the memory map of the video RAM of FIG. 2, 1024 bytes from address 0 to address 1023 are used as a sprite generator table (SPG); 768 bytes from address 1024 to address 1791 being used as a pattern name table (PNT); 128 bytes from address 1792 to address 1919 being used as a sprite attribute table (SAT); 32 bytes from address 1920 to address 1951 being used as a color table (CT); and 96 bytes from address 1952 to address 2047 being unused yet; and 2048 bytes from address 2048 to address 4095 being used as a pattern generator table (PGT).

The pattern generator table PGT is capable of storing a specific pattern of 8 pixels by 8 pixels by using 8 bytes respectively for instance, and therefore 256 patterns of 8 by 8 pixels can be stored. The pattern information stored in the pattern generator table PGT is transmitted from the read-only memory ROM at an initial state of the device by the operation of the central processing unit CPU. However, the pattern generator table PGT may of course be a read-only memory.

In the storing region including 8-byte portions of the pattern generator table PGT are stored specific patterns of 8 by 8 pixels are respectively stored, and respective specific patterns can be designated by pattern names assigned to respective storing regions in which the specific patterns are respectively stored. In the case of the pattern generator table PGT of FIG. 2, 256 patterns can be designated by way of 256 pattern names from pattern name #1 through pattern name 256.

Nextly, the pattern name table PNT comprises a storing capacity corresponding to a total number of displaying sections imagined on the screen of the display unit CRT so as to store information indicating which section is of which pattern name of the pattern generator table PGT.

In an example of FIG. 3, the total number of sections set in the display unit screen is [32 columns×24 rows]=768, and since 1 byte is used as the amount of informtion for indicating 1 section, the pattern name table PNT has a storing capacity of 768 bytes as mentioned in the above.

In the case that a necessary number of patterns are stored in the pattern generator table PGT of the video RAM, and that necessary pattern names assigned in correspondence with respective patterns are stored in the respective sections of the display unit screen of the pattern name table PNT, the video display processor VDP produces a composite video signal complying with a specific standard system where the contents of the picture is determined by information stored in the pattern name table PNT of the video RAM, information stored in the pattern generator table PGT, and information stored in the color table CT when necessary, and the produced composite video signal being fed to the display CRT for displaying a specific pattern on the screen of the display unit CRT.

The above description is related to a case of displaying under a display mode in which a specific one of patterns stored in the pattern generator table PGT is displayed at a specific section among 768 sections, namely, so called graphic mode. When displaying a pattern with such a graphic mode, the position of the pattern is designated by the pattern name table PNT, and therefore, when it is intended to move a pattern on the display unit screen, the pitch of pattern movement on the display unit screen is 1 section (distance of 8 pixels).

In order to cause the pattern to move smoothly with the pitch of pattern movement on the display unit screen being made small, the pattern stored in the sprite generator table SGT is moved on the display unit screen at a pitch of 1 pixel with a change in co-ordinates.

The pattern to be stored in the sprite generator table SGT is sprite data which may be of either 8 pixels by 8 pixels or 16 pixels by 16 pixels. Respective patterns stored in the sprite generator table SGT are given sprite names separately as #0, #1 . . . #N, a sprite surface corresponding to a pattern with respective sprite names are arranged so that smaller numerical values indicated by the sprite names have higher priority.

In the memory map of the video RAM shown in FIG. 2, since 1024 bytes from address 0 to address 1023 are used as the sprite generator table SGT as described in the above, 128 patterns (sprite name #0 through #127) can be stored in the case of 8 pixels by 8 pixels in this case, and also 32 patterns (sprite name #0 through #31) can be stored in the case of 16 pixels by 16 pixels. In the case that 2048 bytes are assigned to the sprite generator table SGT of the video RAM, it is a matter of course that the number of patterns which can be stored in the sprite generator table SGT is twice as much as the above example.

Since sprite position (1 byte for designating each of vertical position and horizontal position), name of display sprite (1 byte), color code and display sprite termination code (1 byte) and the like are set in the sprite attribute table SAT by using 4 bytes for each one sprite, in the case that 128 bytes are used as the sprite attribute table SAT, information of 32 sprites is stored in the sprite attribute table SAT.

The position of a sprite is determined with a vertical position (a numerical value indicating the vertical order of picture point) and a horizontal position (a numerical value indicating the horizontal order of pictue point) being written in the sprite attribute table SAT, where a co-ordinate of 49,152 picture points determined by 256 picture points (8 pixels by 32 sections) of horizontal direction (X direction) and 192 picture points (8 pixels by 24 sections) of vertical direction (Y direction) is provided wherein an origin of the sprite is set to the left top end, and the movement of the sprite is effected with a pitch of 1 pixel.

In the spectrum display device for audio signals according to the present invention, a spectrum of an audio signal is displayed on a screen of a display unit by way of a bar graph for instance as shown in FIG. 4 by an arrangement such that the selection of a pattern to be displayed on the screen of the display unit and the designation of the way of movement of the pattern are effected by data written in the pattern name table PNT in correspondence with a pretermined power spectrum value among the result of spectrum analysis of the audio signal; or by an arrangement such that the selection of a pattern to be displayed on the screen of the display unit and the designation of the way of movement of the pattern are effected by data written in the pattern name table PNT and the sprite attribute table SAT in correspondence with a predetermined power spectrum value among the result of spectrum analysis of the audio signal with either a plurality of sorts of patterns being stored in the pattern generator table PGT or a plurality of sorts of patterns being stored in the pattern generator table PGT and the sprite generator table SGT.

In FIG. 4 showing an example of a displaying state on the screen of the display unit CRT, various display patterns, such as the alphabetic letters SPECTRUM ANALYZER written horizontally at the top of the screen, letters and numerals dB, 0, −10, ... −40 and so on indicated vertically at the left and right of the screen, numerals for frequencies, alphabetic letters K, Hz arranged vertically, and vertical bars, are all prepared with the data being prestored in the read only memory ROM1. At the beginning of the operation of the spectrum display device of FIG. 1, the above-mentioned various patterns stored in the read only memory ROM1 is transferred to and stored in the pattern generator table PGT of the video RAM via the central processing unit CPU and the video display processor VDP, so as to be used for indication at the screen of the display unit CRT. This point will be described in detail hereinafter.

Figure 5:
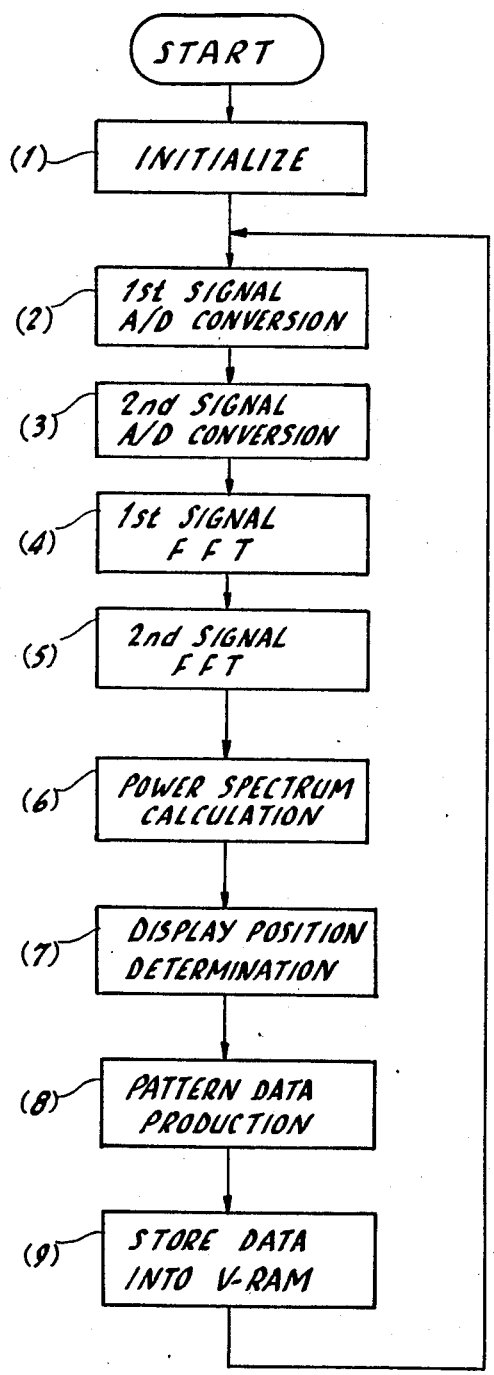
FIG. 5 is a flow chart showing the operation of the central processing unit used in the embodiment of FIG. 1.

The central processing unit CPU produces data necessary for displaying the spectrum of an audio signal by executing steps in a flow chart of FIG. 5, and the data is fed to the video display processor VDP and to the video RAM to cause the display unit CRT to display the spectrum as shown in FIG. 4.

In the flowchart of FIG. 5, at the START power is applied to start the display device, and subsequently in STEP (1) initialization (system initialization) is effected to clear the AD converter ADC, the main memory RAM, the video ram V.RAM and the like, while the registers of the video display processor VDP are set, and using region setting, in which it is determined which storing region of the video ram V.RAM is used for which table, as well as operating mode setting is performed, and a predetermined sort of pattern information (for example, the pattern information of characters and numerals and the pattern information of the vertical bars of FIG. 4) is transmitted from the read-only memory ROM1 via the video display processor VDP to the pattern generator table PGT, and predetermined pattern information is transmitted from the read-only memory ROM1 to the sprite generator table SGT, and furthermore, sprite names, Y-ordinate, color data and the like are transmitted from the read-only memory ROM1 to the sprite attribute table SAT.

The central processing unit CPU repeatedly executes respective STEPs from STEP (2) to STEP (9) so that control of the multiplexer MPX, control of AD conversion in the AD converter ADC, various calculations, storing of various data into the main memory RAM, and transmission of pattern information to the video RAM.V RAM are repeatedly effected.

First of all in the STEP (2), the multiplexer MPX is controlled so that the first signal ranging from frequency fl to fc applied from the band pass filter BPF1 is fed via the multiplexer MPX to the AD converter ADC, and an AD conversion start signal is fed to the AD converter ADC causing the AD converter ADC to perform sampling and quantization at a predetermined low sampling frequency so that a predetermined number (n) of digital data of a first group is stored in the main memory RAM in sequence.

Assuming that the first signal outputted from the band pass filter BPF1 ranges from 25 Hz to 1.6 KHz, while the sampling frequency of the AD converter ADC is 3.2 KHz to obtain first group digital data (n=128) which are stored in the main memory RAM, when FFT operation is performed in a subseqent STEP (4) by using the 128 digital data of the first group, which has been stored in the main memory RAM, 64 pieces of spectrum information are resulted at an interval of 25 Hz. The principle of obtaining spectrum data whose number is one half the number of input data is well known, for instance, such a principle is described in THE FAST FOURIER TRANSFORM by Prentice and Hall, published in 1974.

After the first group digital data is stored in the main memory RAM in the STEP (2), a STEP (3) is executed in which the multiplxer MPX is controlled so that the second signal ranging from frequecy fc to fh from the band pass filter BPF2 is fed to the AD converter ADC, and an AD conversion start signal is fed to the AD converter ADC causing the AD converter to perform sampling and quantization at a predetermined high sampling frequency so that a predetermined number (m) of digital data of a second group is stored in the main memory RAM in sequence.

Assuming that the first signal outputted from the band pass filter BPF2 ranges from 1.6 KHz to 20 KHz, while the sampling frequency of the AD converter ADC is 40 KHz to obtain second group digital data (m=128) which are stored in the main memory RAM, when FFT operation is performed in a subseqent STEP (5) by using the 128 digital data of the second group, which has been stored in the main memory RAM, 64 pieces of spectrum information are resulted at an interval of 312.5 Hz.

Following the above-mentioned STEPs (2) and (3), in the STEP (4) FFT operation is effected with the n digital data of the first group stored in the main memory RAM being read out, and then n/2 spectrum data resulted therefrom is stored in the RAM. The FFT operation is exectued in accordance with a program stored in the read-only memory ROM1 where FFT operation is peformed within an extremely short period of time since the read-only memory ROM is of high-speed type. This also applies to the FFT operation executed in the subsequent STEP (5).

In the STEP (5), FFT operation is effected with the m digital data of the second group stored in the main memory RAM being read out, and then m/2 spectrum data resulted therefrom is stored in the main memory RAM.

In a STEP (6), power spectrum calculation is effected in connection with spectrum data obtained in the above-mentioned STEPs (4) and (5), and the results thereof are stored in the main memory RAM.

The power spectrum calcuation may be executed in connection with only spectrum data representing the signal amplitude at exact frequency values of frequency divisions constituting the spectrum to be displayed on the display unit screen or in connection with each of spectrum data included in each frequency division having a center or representative frequency corresponding to the frequency value to be displayed on the display unit screen so that a maximum value therof is picked up to be adopted as the magnitude at a frequency value to be displayed on the display unit screen. For instance, the level at 100 Hz may be displayed as the level of 100 Hz sub-band or frequency division, while a maximum level among a plurality of levels at different frequencies within respective sub-bands or frequency divisions may be displayed as follows:

| SUB-BANDS | FREQUENCIES FOR LEVEL DETECTION |
| --- | --- |
| 200 Hz | 175 Hz, 200 Hz |
| 1.0 KHz | 925 Hz, 950 Hz, 975 Hz, 1,000 Hz, 1,025 Hz, 1,050 Hz, 1,075 Hz |
| 1.2 KHz | 1,100 Hz, 1,125 Hz, 1,150 Hz, 1,175 Hz 1,200 Hz, 1,225 Hz, 1,250 Hz, 1,275 Hz 1,300 Hz, 1,325 Hz |
| 10 KHz | 9,062.5 Hz, 9,375 Hz, 9,687.5 Hz, 10,000 Hz, 10,312.5 Hz, 10,625 Hz |

The above-mentioned STEPs (4) through (6) are steps for spectrum analysis.

Figure 6:
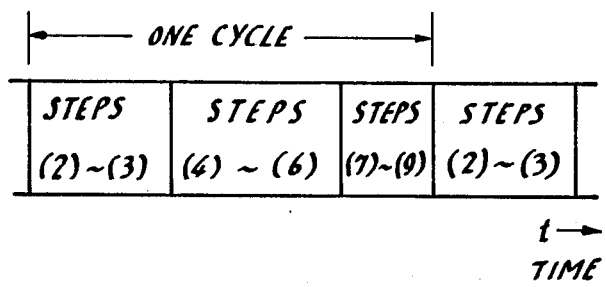
FIG. 6 is a timing chart showing timing relationship between respective steps of the flow chart of FIG. 5.

Nextly, in a STEP (7) it is determined which position on the display unit screen, which is marked with digital values, corresponds to the magnitude of the spectrum calculated in the above-mentioned STEP (6) (display position determination), and subsequently in a STEP (8) data to be rewritten into the pattern name table PNT, or data to be written into the pattern name table PNT, and data, if necessary, to be written into the sprite attribute table SAT is produced in correspondence with the data determined in the STEP (7). In a following STEP (9) the above-mentioned data is transferred via the video display processor VDP to the video RAM and thus the video dispaly processor VDP produces a composite video signal on the basis of data written into the video RAM, which composite video singal is sent to the display unit CRT to cause the same to display the spectrum as a pattern as shown in FIG. 4. FIG. 6 is a diagram for the description of the repetition of the operations of the spectrum display device, and the operations are repeated with unit of a period of time corresponding to one cycle in the diagram.

The spectrum display pattern shown in FIG. 4 as an example is such that specrum is displayed at respective frequencies of 50 Hz, 75 Hz, 100 Hz, 125 Hz, 150 Hz, 200 Hz, 250 Hz, 300 Hz, 400 Hz, 500 Hz, 625 Hz, 800 Hz, 1 KHz, 1.2 KHz, 1.5 KHz, 2 KHz, 2.5 KHz, 3 KHz, 4 KHz, 5 KHz, 6.3 KHz, 8 KHz, 10 KHz, 12 KHz, 16 KHz, and 20 KHz. However, the frequencies to be displayed may be changed if desired.

In the case that the input signal to be an objective of spectrum analysis is a music signal, the state of display would be such that the lengths of the vertical bars on the display unit screen changes every moment. The spectrum display such as shown in FIG. 4 may also be effected by only designating a pattern written into the pattern generator table PGT by the pattern name table PNT.

In the spectrum display device according to the present invention shown in FIG. 1, since the frequency range of the audio signal, which is an objective of spectrum display, is divided into a plurality of frequency bands so that FFT operation is effected such that spectrum information at a desired frequency interval is obtained for respective frequency bands obtained by the division, the number of digital data necessary for FFT operation can be remarkably reduced when compared to the case in which spectrum information is obtained at a predetermined frequency interval throughout the entire frequency range of the audio signal which is the objective of spectrum display, and therefore, even if FFT operations in connection with respective frequency bands obtained by the division into a plurality are executed in series along time base as described with reference to the flow chart of FIG. 5, the total time necessary for FFT operations in connection with signals of respective frequency bands can be reduced when compared to the case in which FFT operation is executed without dividing the band, and eventually, the spectrum displaying operation according to the present invention can be performed in a condition which is close to real time operation.

Although two band pass filters BPF1 and BPF2 are employed in the above-described embodiment of FIG. 1 for dividing the entire frequency range of the input audio signal into first and second signals of low and high frequency bands, such a plurality of band pass filters may be omitted so that AD conversion of the input audio signal is effected with a constant sampling frequency throughout the entire frequency range of the input audio signal. When the spectrum display device is arranged to process the input audio signal without dividing the entire frequency range thereof into a plurality, the output signal from the selection circuit SW may be directly applied to the AD converter ADC. In other words, the multiplexer MPX and the band pass filters BPF1 and BPF2 may be omitted. However, in order to reduce possible aliasing noises, which are apt to occur during AD conversion as is well known, a single band pass filter is preferably employed so that the frequency range of the audio signal applied to the AD converter ADC ranges from fl to fh.

Figure 7:
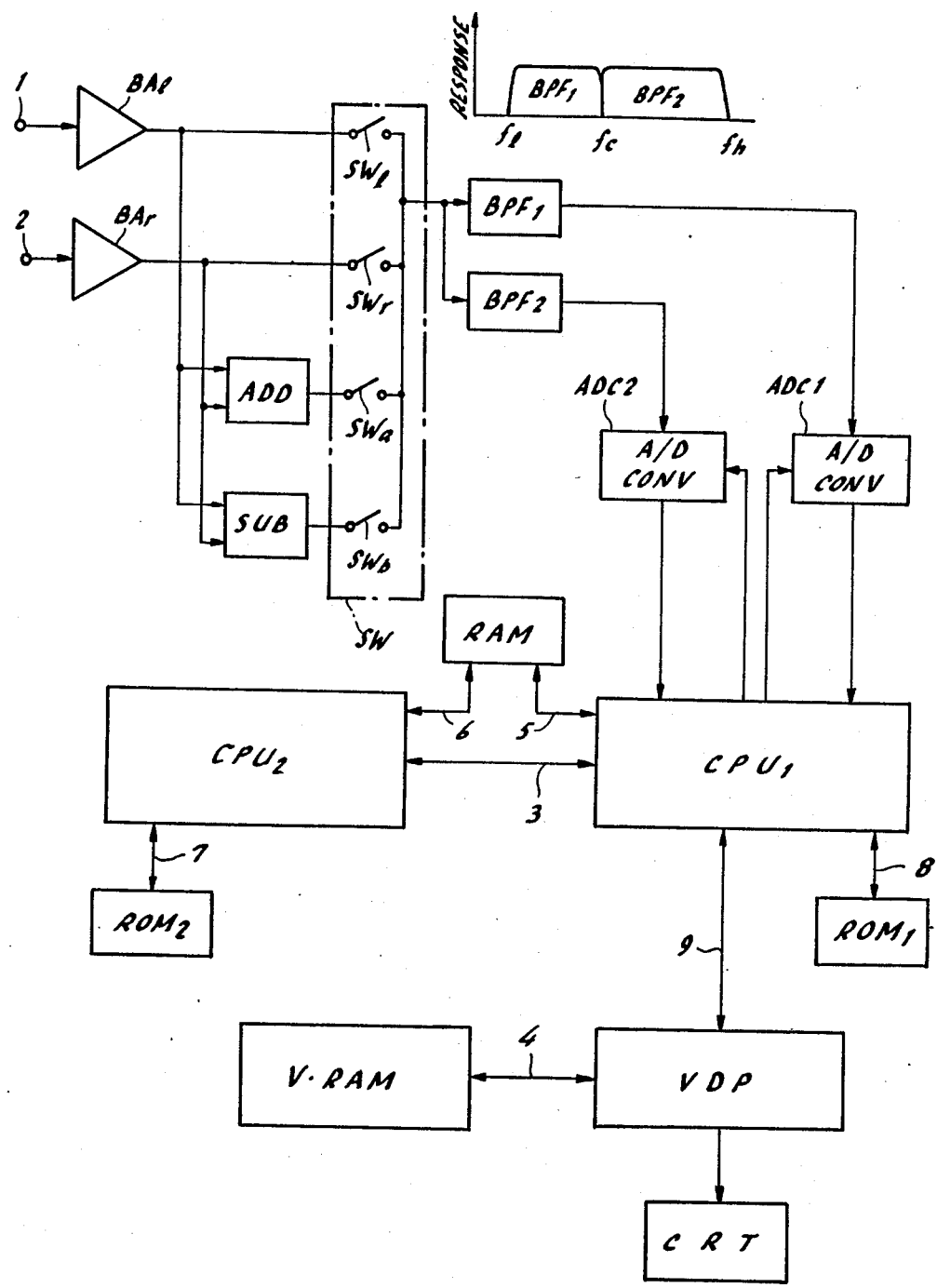
FIG. 7 is a schematic block diagram of a second embodiment of the spectrum display device according to the present invention.

While FFT operations in connection with respective frequency bands obtained by dividing the frequency range of the audio signal, which is an ojective of spectrum display, are performed in series along time base in the spectrum display device of the embodiment of FIG. 1, FIG. 7 is a block diagram showing an embodiment of the spectrum display device for audio signals, which is arranged to be able to display a spectrum of an audio signal at a speed further faster than that in the spectrum display device of FIG. 1.

The spectrum display device of FIG. 7 comprises two central processing units CPU1 and CPU2 so as to enable parallel FFT operations along time base in connection with signals of respective frequency bands obtained by division, and therefore, time required for spectrum analysis is reduced when compared to the case of the structure of FIG. 1, thereby spectrum display is performed under a condition which is further close to real time.

Namely, in the spectrum display device for audio signals shown in FIG. 7, output signals from two band pass filters BPF1 and BPF2, which divide the frequency range fl to fh of the audio signal used as an objective of spectrum analysis, are AD converterd in parallel on time base, and subsequently FFT operations are effected in parallel so that reduction in time necessary for spectrum analysis can be achieved.

In FIG. 7, a first signal having a frequency range fl to fc, which is outputted from the band pass filter BPF1, is applied to an AD converter ADC1, while a second signal having a frequency range fc to fh, which is outputted from the band pass filter BPF2, is applied to another AD converter ADC2.

The above-mentioned two AD converters ADC1 and ADC2 are arranged such that their AD converting timings are controlled by control signals from the central processing unit CPU1.

In FIG. 7, the reference RAM is a main memory, while references ROM1 and ROM2 are read only memories, and references 3 through 9 are busses. In the following description it is assumed that the frequency range fl to fh of the audio signal, which is an objective of spectrum analysis, is between 25 Hz and 20 KHz, while the above-mentioned audio signal is divided into a first signal ranging from 25 Hz to 1.6 KHz and a second signal ranging from 1.6 KHz to 20 KHz by way of the band pass filters BPF1 and BPF2, and it is arranged such that result of spectrum operation is obtained with a frequency interval of 25 Hz in connection with the first signal, and result of spectrum operation is obtained with a frequency interval of 625 Hz in connection with the second signal.

As described in the above, in order to obtain a result of spectrum operation with a frequency interval of 25 Hz in connection with the first signal having a frequency range from 25 Hz to 1.6 KHz, 128 digital data is required for FFT operation for the first signal as described in connection with the spectrum display device of FIG. 1, where the sampling frequency on AD conversion for converting the first signal into a digital signal is 3.2 KHz.

On the other hand, in order to obtain a result of spectrum operation with a frequency interval of 625 Hz in connection with the second signal having a frequency range from 1.6 KHz to 20 KHz, 64 digital data is required for FFT operation for the second signal as described in connection with the spectrum display device of FIG. 1, where the sampling frequency on AD conversion for converting the second signal into a digital signal is 40 KHz.

In the above example, time length T1 necessary for outputting 128 digital data, which is required for FFT operation in connection with the first signal, from the AD converter ADC1 is $(1/3200) \times 128 = 0.04$ sec, while time length T2 necessary for outputting 64 digital data, which is required for FFT operation in connection with the second signal, from the AD converter ADC2 is $(1/40000) \times 64 = 0.0016$ sec. Namely, the AD converting time T1 for the first singal is consideraly longer than the AD converting time T2 for the second signal.

Furthermore, since the number of digital data used for FFT operation of the first signal, i.e. 128, is twice the number of digital data used for FFT operation of the second signal, i.e. 64, it is understood that time length necessary for FFT operation of the first signal is two or more times as long as time length necessary for FFT operation of the second signal.

As described in the above, in the above example the proportion of signal processing time relative to the first signal to the time necessary for the operation of the spectrum display device is great. Therefore, in the spectrum display device illustrated in FIG. 7, FFT operation and power spectrum calcuation of the first signal, which occupy a great propotion to the signal processing time, are executed by the second central processing unit CPU2 provided in addition to the first central processing unit CPU1, while remaining controls are executed by the first central processing unit CPU1, thereby reducing the time for spectrum analysis. As a result, the spectrum display device is capable of operating at substantially real time.

Figure 9:
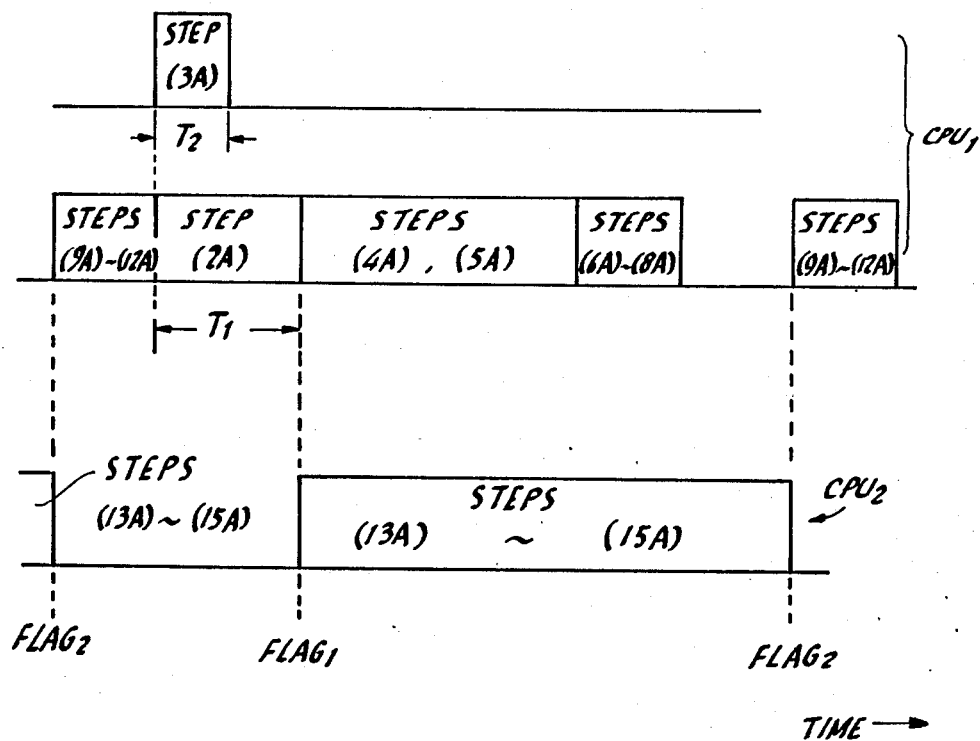
FIG. 9 is a timing chart showing timing relationship between respective steps of the flow chart of FIG. 8.
Figures 8A, 8B:
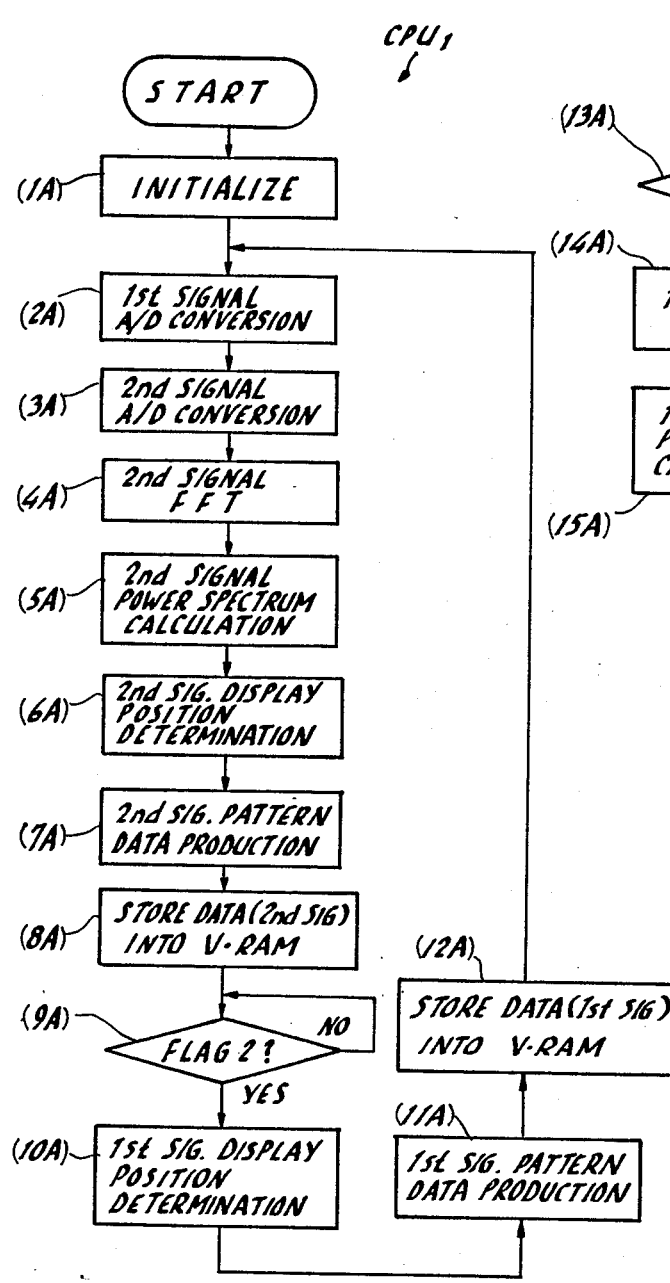
FIGS. 8A and 8B are flow charts showing the operation of the two central processing units used in the embodiment of FIG. 7.

FIGS. 8A and 8B are flow chart for the description of the operation of the spectrum display device for audio signals, shown in FIG. 7. FIG. 9 is a timing chart showing the relationship between the opeation of the first central processing unit CPU1 and the second central processing unit CPU2.

FIG. 8A is a flow chart showing the operation of the first central processing unit CPU1, whiel FIG. 8B is a flow chart showing the operation of the second central processing unit CPU2. The timing chart of FIG. 9, is an explanatory diagram for the time relationship between respective steps of the flow charts of FIGS. 8A and 8B.

There is the following relationship between the contents of the operations executed in respective STEPs (1A) through (15A) of the flow charts of FIGS. 8A and 8B and the contents of the operations executed in respective steps (1) through (9) of the flow chart of FIG. 5. Namely, STEP (1A) and STEP (1), STEP (2A) and STEP (2), STEP (3A) and STEP (3), STEP (4A) and STEP (5), STEP (5A) and STEP (6), STEP (6A) and STEP (7), STEP (7A) and STEP (8) respectively correspond to each other, while STEP (9A) and STEP (13A) do not have corresponding steps in the flow chart of FIG. 5. Remaining corresponding steps are such that STEP (10A) to STEP (7), STEP (11A) to STEP (8), STEP (12A) to STEP (9), STEP (14A) to STEP (4), and STEP (15A) to STEP (6). In the above, in the STEP (6) through STEP (9) of the flow chart shown in FIG. 5, control operations are executed under a condition in which the first and second signals are lumped.

The operation of the spectrum display device according to the present invention, shown in FIG. 7 will be briefly described with reference to the flow charts of FIGS. 8A and 8B and the timing chart of FIG. 9 hereinafter.

At the START in the flow chart of FIG. 8A, power is applied to start the display device, and subsequently in the step (1A) initialization (system initialization) is effected. The initialization is effected to clear the AD converters ADC1 and ADC2, the main memory RAM, the video RAM and the like, to set the registers of the video display processor VDP, to set using-region of the storing region of the video RAM, to set operating mode, to transfer predetermined pattern information from the read-only memory ROM1 to the pattern generator table PGT and to the sprite generator table SGT if necessary, and to transfer sprite names, X-ordinate, and color data to the sprite attribute table SAT.

While the central processing unit CPU1 repeatedly executes the STEP (2A) through STEP (12A), the other central processing unit CPU2, when detecting a flag 1 in the STEP (13A), which flag is arranged to turn to "1" when a predetermined number of digital data from the first signal has been stored in the main memory RAM with the first signal being AD converted in the STEP (2A), executes FFT operation in connection with the first signal in the STEP (14A), and subsequently executes power spectrum calculations in the STEP (15A). When a flag 2, which turns to "1" at the time of completion of power spectrum calcualtions in connection with the first signal, is detected, the first central processing unit CPU1 performs control operation so that display operation relative to the first signal is effeced in the STEP (10A) through STEP (12A). Furthermore, the first central processing unit CPU1 executes FFT operation in the STEP (4A) in connection with the predetermined number of digital data of the second signal, which has been stored in main memory RAM after execution of the STEP (3A), and subsequently, executes power spectrum calculations in the STEP (5A), and controls the device so that spectrum display operation for the second signal is carried out by the execution of the STEPS (6A) through (8A) by using the results of the STEP (5A).

The relationship between respective steps of the control operations executed by the central processing units CPU1 and CPU2 on time base is as shown in FIG. 9, and in the spectrum display device for audio signals according to the present invention, shown in FIG. 7, inasmuch as the spectrum analysis {STEP (13A) through STEP (15A)} of the first signal, which requires a long period of time for signal processing, is executed by the second central processing unit CPU2 within a short period of time in accordance with the program stored in the high-speed ROM ROM2, while the control operations of the first and second central processing units CPU1 and CPU2 are arranged to be peform in parallel on time base, it it apparent that it is possible, in the embodiment device shown in FIG. 7, to display spectrum of an audio signal on a display unit screen with a time further close to real time when compared to the embodiment device shown in FIG. 1.

Namely, as is apparent from the timing chart shown in FIG. 9, while the AD conversion of the first signal by the AD converter ADC1 executed in the STEP (2A) under the control of the first central processing unit CPU1 and the AD conversion of the second signal by the AD converter ADC2 executed in the STEP (3A) are substantially peformed in parallel on time base, since AD converting time with respect to the first signal is longer than the AD converting time with respect to the second signal as in the above-described example, when the starting instant of AD conversion for both first and second signals is made identical, the ending instant of AD conversion with respect to the first signal is necessarily behind the ending instant of the AD conversion with respect to the second signal.

Even if the FFT operation and power spectrum calculation in connection with the first signal and the FFT operation and power spectrum calculation in connection with the second signal are respectively executed by the central processing units CPU1 and CPU2 in parallel immediately after the AD conversion in connection with the first signal, the calculations for the second signal by the first central processing unit CPU1 terminate before the calculations for the first signal by the second central processing unit CPU2. When the results of spectrum analysis in connection with the second signal are obtained by the execution of the STEPS (4A) and (5A), the results are immediately displayed on the display unit screen in the STEPS (6A) through (8A), and simultaneously the second central porocessing unit CPU2 is capable of executing spectrum analysis {STEPS (13A) through (15A)} in connection with the first signal, thereby operating time is effectively and readily reduced.

Reference is made to FIG. 10A which shows a third embodiment spectrum display device according to the present invention. The circuit arrangement of FIG. 10A differs from that of FIG. 1 in that an absolute value detector AVD and a sign detector SD are additionally provided. Namely, both the absolute value detector AVD and the sign detector SD are responsive to the output signal from the multiplexer MPX, where an output signal from the absolute value detector AVD is applied to the AD converter AVD, and an output signal from the sign detector SD is applied to the central processing unit CPU.

As the absolute value detector may be used a full-wave rectifying circuit, while a circuit arrangement including a comparator arranged to output high and low level outputs depending on positive and negative input signals and a latch for temporarily storing output from the comparator, may be used as the sign detector SD.

FIG. 10B shows an example of the sign detector having a comparator and a latch whose latching timing is determined by a leading (positive-going) edge of a latch-timing pulse fed from the central processing unit CPU. The sign detector SD thus outputs a signal of one bit indicative that the analog signal is either positive or negative, and this one bit signal from the sign detector is stored in the main memory together with AD converted digital data as data to be used in FFT operation.

The output signal from the multiplexer MPX, which may be either the first or second signal, is fed via the absolute value detector AVD to the AD converter ADC. The above-mentioned absolute value detector AVD and the sign detector SD are employed to increase the resolution in AD conversion by one bit.

The embodiment of FIG. 10A also shows an RF converter RFC and a TV receiver TVS. The combination of the RF converter and the TV reciever TVS may be used in place of the cathode ray tube display unit CRT or together therewith to display a resultant spectrum of the input audio signal in a different manner.

Although the central processing unit CPU of FIG. 10A may operate the program shown in FIG. 5 in the same manner as in the first embodiment, another program may be used therefor. The following description is made assuming that the central processing unit CPU of FIG. 10A operates in accordance with a predetermined program which is represented by flow charts of FIGS. 11A and 11B. The flow chart of FIG. 11A is a main routine, while the other flow chart of FIG. 11B is an interrupt service routine.

Figure 11A:
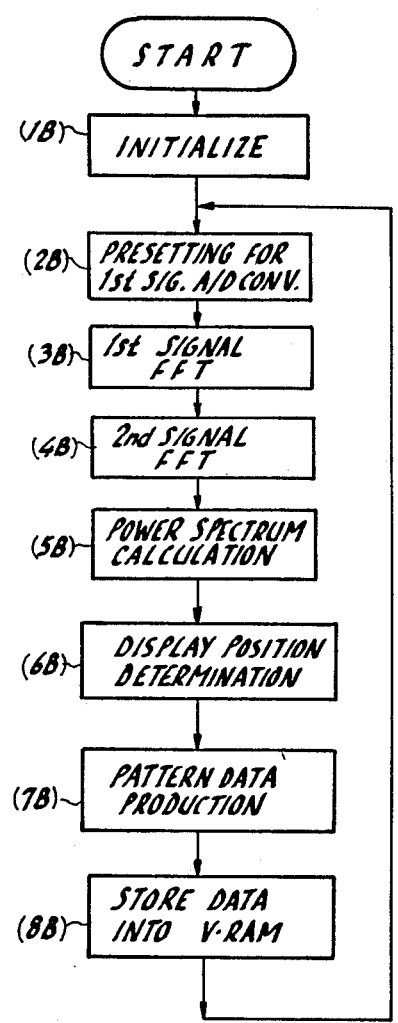
FIGS. 11A and 11B are flow charts showing the operation of the central processing unit used in the embodiment of FIG. 10A.
Figure 11B:
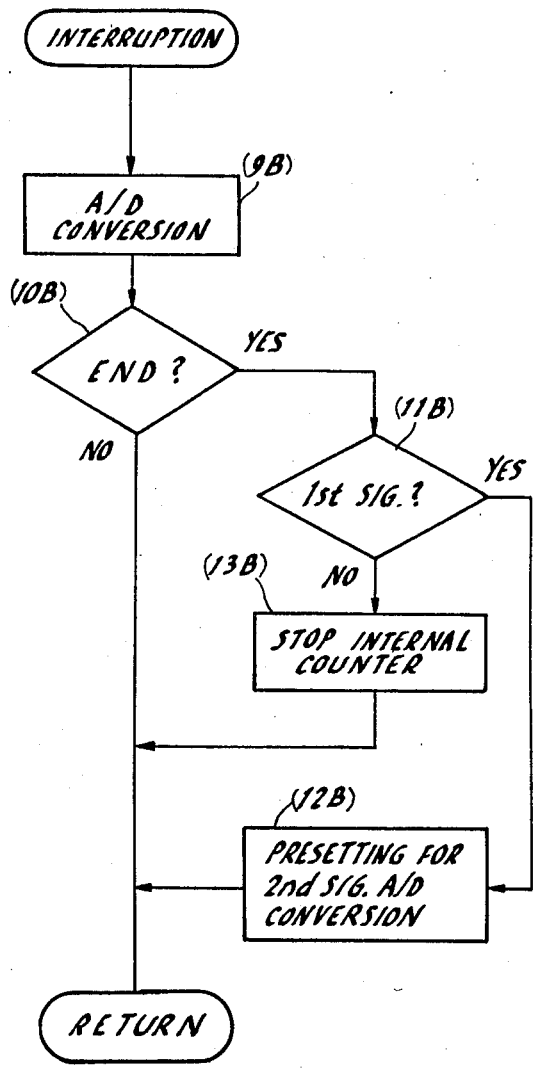

In the flow chart of FIG. 11A, when power is applied to the spectrum display device of FIG. 10A, the central processing unit CPU starts operating, and in a STEP (1B) initialization is effected in the same manner as in the previous embodiments. Unless interruption does not occur the central processing unit CPU repeatedly executes STEPS (2B) through (8B). Interruption is arranged to periodically occur at an interval of a specific sampling period, which is set in an internal counter built in the central processing unit CPU, and when interruption occurs, the central processing unit CPU starts executing STEPS (9B) through (12B) of the interrupt service routine (see FIG. 11B) with the execution of the steps of the main routine being interrupted. After the interrupt service routine is completed, the execution of the steps of the main routine is continued from a point at which interruption has occurred.

Figure 12:
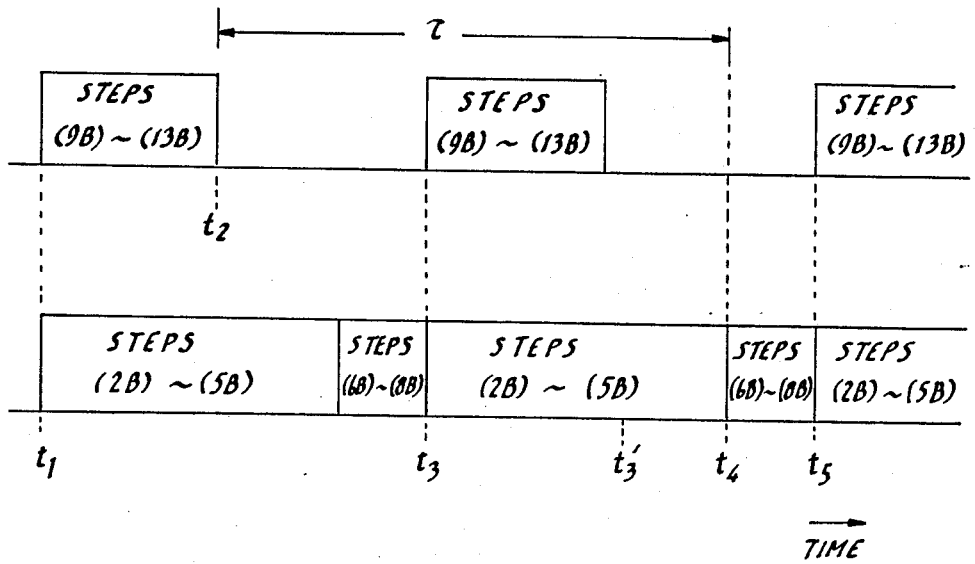
FIG. 12 is a timing chart showing timing relationship between respective steps of the flow chart of FIGS. 11A and 11B.

The central processing unit CPU is arranged to perform control operations other than FFT operations, power spectrum calculations, converting-to-pattern information operations, and control operations for analog-to-digital conversion during time which is other than a predetermined period of time at every sampling period of the analog-to-digital converting means used for AD conversion. FIG. 12 is a timing chart showing a series of control operations executed by the central processing unit CPU of FIG. 10A.

In FIG. 12, although the executing period of STEPS (9B) through (13B) of the interrupt service routine are illustrated to be overlapped with the executing period of STEPS (2B) through (5B) along time base, the STEPS (9B) through (13B) and the STEPS (2B) through (5B) should be illustrated as having a comb-like or interdigit shape when viewed microsopically.

This point will be described in detail hereinafter. Interruptions repeatedly occurs at an interval corresponding to a sampling period, which is expressed in terms of Ts, is determined by an internal counter of the central processing unit CPU. When interruption occurs, the interrupt service routine of FIG. 11B takes place, where necessary time length from the instant of application of an AD conversion starting pulse to the AD converter ADC to the instant that output digital signals from the AD converter ADC are stored into the main memory RAM is expressed in terms of $\Delta T$. Namely, the time length $\Delta T$ is used for the execution of the STEPS (9B) through (13B) of the interrupt service routine of FIG. 11B. Therefore, remaining time within the sampling period Ts other than the time $\Delta T$ used for each one cycle of the interrupt service routine, i.e. Ts$-\Delta T$ is used for the execution of the steps (2B) through (5B) of the main routine.

For instance when the first signal ranges from 25 Hz to 1.6 KHz and the second signal ranges from 1.6 KHz to 20 KHz as in the above example, the AD conversion of the first signal is executed at an interval of a sampling period Ts1 of (1/3200) sec, while the other AD conversion of the second signal is executed at an interval of another sampling period Ts2 of (1/40000) sec. Since the above-mentioned time length $\Delta T$ necessary for the execution of the interrupt service routine is considerably shorter than either of the sampling period Ts1 or Ts2, the central processing unit CPU is used for the execution of the interrupt service routine only for a short period of time $\Delta T$ at an interval of the sampling period Ts, i.e. Ts1 or Ts2. As a result, remaining time given by Ts$-\Delta T$ is used for the execution of the STEPS (2B) through (8B).

In the case that an interruption occurs to interrupt the exeuction of the STEPS (3B) through (8B) with the sampling period Ts being preset to Ts1, which is suitable for the first signal, in the STEP (2B), the first signal is fed via the multiplexer MPX to the AD converter ADC, and the AD conversion starting pulse is applied to the AD converter ADC to commence AD conversion of the first signal. Output digital data resulted from the AD conversion is then stored in the main memory RAM.

During the execution of the interrupt service routine, it is checked and determined whether a predetermined number of AD converting operations has been executed (i.e. wherther a predetermined number of digital data has been obtained) in the STEP (10B). If the predetermined number has not reached yet, namely if the determination in the STEP (10B) is NO, the interrupt service routine is terminated. On the other hand, if the predetermined number has reached, namely if the determination in the STEP (10B) is YES, the STEP (11B) is executed to check whether the objective of AD conversion is the first signal or not. If YES, the STEP (12B) is executed, and on the other hand, if NO, the STEP (13B) is executed.

The STEP (12B) is provided to alter the preset value of the internal counter for changing the sampling period Ts, and to change the number of digital data to be obtained. Namely, assuming that the first signal is first AD converted with the preset value corresponding to the sampling period Ts1 suitable for the first signal, the preset value is changed to the other value corresponding to the sampling period Ts2 suitable for the second signal. Simultaneously, the number of digital data to be obtained in connection with the first signal is also changed to another number suitable for the second signal.

In the case that the determination in the STEP (11B) is NO, the STEP (13B) is executed to stop counting by the internal counter.

After the execution of either STEP (12B) or (13B), the interrupt service routine is terminated so that the operational flow returns to the main routine of FIG. 11A. From the above it will be understood that AD conversion is executed in connection with the first signal for a predetermined number (n) of times to obtain a predetermined number of digital data, i.e. 128 digital data in the above-described embodiment. And then AD conversion is executed in connection with the second signal for a predetermined number (m) of times to obtain a predetermined number of digital data, i.e. 128 digital data in the above-described embodiment. In this way when 128 digital data of the second signal is obtained, the internal counter is stopped by the exeeution of the STEP (13B) terminating the interrupt service routine.

After n digital data for the first signal and m digital data for the second signal have been stored in the main memory RAM in this way wherein n and m are 128 in the above example, n digital data are used in the STEP (3B) of the main routine to execute FFT operation so that n/2 spectrum data is obtained to be stored in the main memory RAM, while m digital data are used in the STEP (4B) of the main routine to execute FFT operation so that m/2 spectrum data is obtained to be stored in the main memory RAM. The above FFT operations are executed within a short period of time in accordance with a program stored in the high-speed read-only memory ROM2. Then in the STEP (5B), the spectrum data obtained in the STEPS (3B) and (4B) are used to execute power spectrum calculations to store the result thereof into the main memory RAM. The following STEPS (6B), (7B) and (8B) are the same as STEPS (7), (8) and (9) of FIG. 5, and description thereof is omitted.

Turning back to FIG. 12, when the program of FIGS. 11A and 11B is executed by the central processing unit CPU shown in FIG. 10A, digital data obtained by AD conversions of the first and second signals within an interval between t1 and t2 is used for FFT operations within an interval between t3 and t4. As a result, the spectrum of the audio signal appeared within the interval between t1 and t2 is displayed on the display unit screen after the instant t4 with a time lag of $\tau$ wherein $\tau$ is the difference between t2 and t4.

Although this time lag $\tau$ is only several hundreds of milliseconds for instance, it is desired to reduce such delay as much as possible. Hence, reference is now made to FIGS. 13A and 13B which show another program for the central procesing unit CPU, which program enables the spectrum display unit to display a spectrum with such time lag being reduced compared to the case of FIGS. 11A and 11B.

FIGS. 13A and 13B respectively show a main routine and an interrupt service routine in the same manner as in FIGS. 11A and 11B. Since the interrupt service routine of FIG. 13B is substantially the same as that of FIG. 11B, desription thereof is omitted. The main routine of FIG. 13A differs from that of FIG. 11A in that various operations in connection with the first signal are executed (see STEPS (1C) through (7C)), and subsequently various operations in connection with the second signal are executed (see STEPS (8C) through (12C)). In detail, immediately after FFT operations (see STEP (3C)) and power spectrum calculations (see STEP (4C)) in connection with the first signal are completed, the spectrum of the first signal is displayed on the screen of the display unit CRT by using the spectrum data obtained from the first signal (see STEPS (5C) through (7C)). Similarly, immediately after FFT operations (see STEP (8C)) and power spectrum calculations (see STEP (9C)) in connection with the second signal are completed, the spectrum of the second signal is displayed on the screen of the display unit CRT by using the spectrum data obtained from the second signal (see STEPS (10C) through (12C)).

Figure 14:
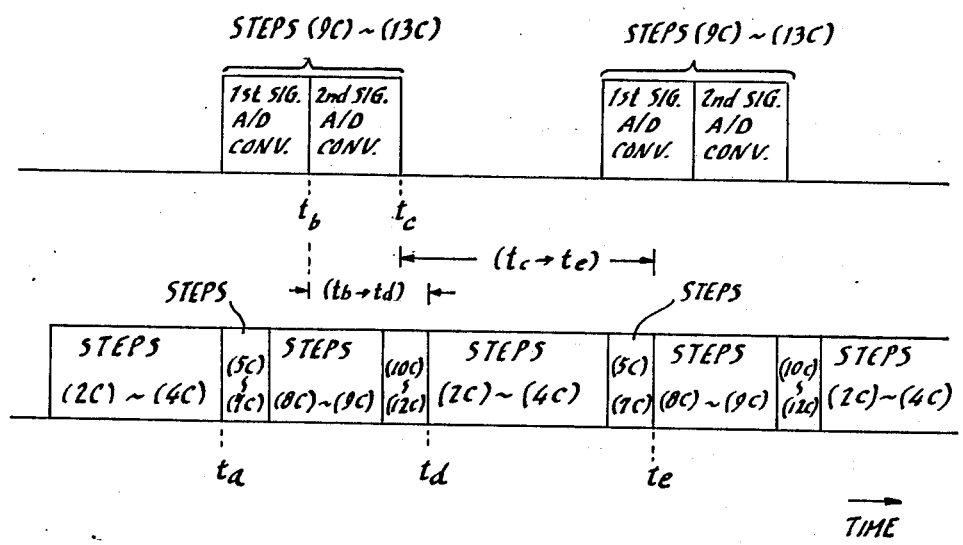
FIG. 14 is a timing chart showing timing relationship between respective steps of the flow charts of FIGS. 13A and 13B.

Comparing the flow chart of FIG. 13A with the flow chart of FIG. 11A, the difference therebetween will be readily understood from the comparison between the timing chart of FIG. 12 and a timing chart of FIG. 14 which shows timing relationship between various steps in the flow charts of FIGS. 13A and 13B. Namely, the time length between an instant $t_b$, by which a predetemrined number of digital data has been obtained for the first signal, and an instant $t_d$, from which FFT operation starts, is shorter than the time length between the instant t2, at which a predetermined number of digital data has been obtained for each of the first and second signals after AD conversion, and the instant t3, from which FFT operation starts. Similarly, the time length between an instant $t_c$, by which a predetemrined number of digital data has been obtained for the second signal, and an instant $t_e$, from which FFT operation starts, is shorter than the time length between t2 and t3' wherein t3' is an instant from which FFT operation for the second signal starts. Accordingly, when the flow chart of FIG. 13A is used to process the input audio signal, time lag which is apt to occur on displaying operation can be effetively reduced.

As is apparent from the detailed description in the above, in the spectrum display device for audio signals according to the present invention an input audio signal is first AD converted into digital data, and then the digital data is used for FFT operation and power spectrum calculation for obtaining spectrum data with which the spectrum of the audio signal is displayed on a display unit screen by way of a predetermined pattern. In an improved emobodiment of the invention, the frequency range which is an objective of spectrum analysis is divided into a plurality of bands, and spectrum analysis is effected at predetemrined frequency intervals for respective frequency bands obtained by the division, and therefore the number of digital data necessary for FFT operation is reduced to shorten the operating time. In a further improved embodiment of the invention, signal processing operations for the above-mentioned respective frequency bands are executed in parallel so that further reduction in operating time is achieved. In another embodiment, analog-to-digital conversion and remaining operations are executed in parallel to reduce operating time. Furthermore, the parallel operation of AD conversion and remaining operations may be combined with the parallel operation of a plurality of signals of a plurality of frequency bands so as to further reduce operating time. Since it is possible to reduce signal processing time for spectrum display according to the present invention as described in the above, the present invention readily provides a spectrum display device which is capable of displaying a spectrum of an audio signal at real time.

The above-described embodiments are just examples of the present invention, and therefore, it will be apparent for those skilled in the art that many modifications and variations may be made without departing from the spirit of the present invention.

What is claimed is:

1. A spectrum display device for an audio signal comprising:
 (a) band-separating means for dividing an input audio signal into plural analog signals each having one of plural different frequency bands;
 (b) analog-to-digital converting means for converting said analog signals derived from said band-separating means into digital signals at a sampling frequency;
 (c) selecting means for selectively and sequentially applying said analog signals derived from said band-separating means to said analog-to-digital converting means;

(d) means for varying said sampling frequency to said analog-to-digital converting means as a function of the frequency band selected to be supplied to said converting means;

(e) a central processing unit for (i) effecting FFT operation in connection with the digital signals derived from said analog-to-digital converting means, (ii) effecting power spectrum calculation in connection with the result of the FFT operation to obtain power spectrum data, (iii) converting said power spectrum data into pattern information corresponding to the amplitude of a plurality of frequencies within a spectrum of said input audio signal, and (iv) deriving data indicative of said pattern information; and (f) a video display processor including a display unit having a screen and a video RAM, said display processor being responsive to data derived from said central processing unit for generating a video signal using picture data stored in the video RAM to thereby display a power spectrum by way of said pattern on said screen of said display unit such that said plurality of frequencies within said spectrum are arranged in sequence on the screen.

2. A spectrum display deviced as claimed in claim 1, wherein said band-separating means comprises a plurality of band pass filters.

3. A spectrum display device as claimed in claim 1, wherein said selecting means comprises a multiplexer having a switching operation controlled by said central processing unit.

4. A spectrum display device as claimed in claim 1, wherein said means for varying comprises another central processing unit.

5. A spectrum display device as claimed in claim 1, further comprising:

(a) an adder for deriving a sum signal by linearly combining first and second signal components of said input audio signal;

(b) a subtractor for deriving a difference signal by linearly combining said first and second signal components;

(c) a selection circuit having input signals responsive to: said first and second signal components, sum signal and difference signal for coupling one of the input signals thereof to said analog-to-digital converting means.

6. A spectrum display device as claimed in claim 1, wherein said central processing unit is arranged to operate to (a) cause said analog-to-digital converting means and said selecting means to sequentially convert a plurality of analog frequency band signals into digital signals, (b) subsequently sequentially execute FFT operations in connection with a plurality of digital data to said plurality of frequency bands, and (c) subsequently sequentially execute power spectrum calculations in connection with a plurality of results of said FFT operations the amplitude of plural frequencies within a spectrum of said input audio signal, and (iv) deriving data indicative of said pattern information, one of said central processing units being arranged to effect FFT operation and power spectrum calculation in connection with the digital signals of a predetermined frequency band among said plurality of frequency bands, said plurality of central processing units being connected to be mutually responsive to each other so that given operations are performed at appropriate timing in each of said plurality of central processing units; and (d) a video display processor having a display unit with a screen and a video RAM for storing picture data from said plurality of central processing units for generating a video signal using the picture data stored in the video RAM to thereby display a power spectrum by way of said pattern on a screen of a display unit such that said plurality of frequencies within said spectrum are arranged in sequence.

7. A spectrum display device as claimed in claim 1 wherein said central processing unit includes a memory, further comprising:

(a) an absolute value detecting circuit responsive to said input audio signal for deriving a unidirectional output signal and for supplying said analog-to-digital converting means with the unidirectional output signal; and (b) a polarity detector responsive to said input audio signal for deriving an output signal indicative of the polarity of the input audio signal and for supplying said central processing unit with the output signal indicative of the input audio signal polarity so that the output signal from said polarity detector and the digital signals from said analog-to-digital converting means are stored in the central processing unit memory.

8. A spectrum display device as claimed in claim 1, wherein said central processing unit is arranged to execute substantially parallel operations by way of a plurality of routines such that operations for controlling said analog-to-digital converting means are repeatedly executed during an interval in which remaining operations are executed.

9. A spectrum display device as claimed in claim 8, wherein said central processing unit is arranged to execute an interrupt service routine for controlling said analog-to-digital converting means.

10. A spectrum display device as claimed in claim 9, wherein said central processing unit comprises an internal counter for setting a sampling period for the analog-to-digital converting means, said central processing unit being arranged to execute said interrupt service routine during an interval of said sampling period.

11. A spectrum display device as claimed in claim 1, wherein said central processing unit is arranged to execute an interrupt service routine for controlling said analog-to-digital converting means.

12. A spectrum display device as claimed in claim 11, wherein said central processing unit comprises an internal counter for setting a sampling period for the analog-to-digital converting means, said central processing unit being arranged to execute said interrupt service routine during an interval of said sampling period.

13. A spectrum display device as claimed in claim 1, wherein said central processing unit is arranged to sequentially perform FFT operations in connection with all the digital signals of said respective frequency bands, and then to sequentially perform power spectrum calculations in connection with all the results of said FFT operations.

14. A spectrum display device as claimed in claim 1, wherein said central processing unit is arranged to sequentially perform operations including said FFT operation and power spectrum calculation in connection with the digital signals of one of said respective frequency bands, and then to sequentially perform operations including said FFT operation and power spectrum calculation in connection with the digital signals of another one of said respective frequency bands.

15. A spectrum display device as claimed in claim 1, wherein said central processing unit is arranged to effect said power spectrum calculation in connection with each of said plurality of frequency bands such that a plurality of amplitude data in each of plural frequencies within each frequency band are obtained first, and then a maximum amplitude datum among said plural amplitude data is used as spectrum data to represent the amplitude in each of said plurality of frequency bands.

16. A spectrum display device for an audio signal comprising:
 (a) band-separating means for dividing an input audio signal into plural signals each having one of plural frequency bands;
 (b) a plurality of analog-to-digital converting means for respectively simultaneously converting a plurality of output signals from said band-separating means into digital signals at different sampling frequencies;
 (c) a central processing unit for effecting (i) FFT operation in connection with the digital signals derived from said plurality of analog-to-digital converting means, (ii) power spectrum calculation in connection with the result of the FFT operation to obtain power spectrum data, (iii) converting said power spectrum data into pattern information corresponding to the amplitude of a plurality of frequencies within a spectrum of said input audio signal, and (iv) deriving data indicative of said pattern information; and
 (d) a video display processor having a display unit having a screen and video RAM for storing picture data, said display processor being supplied with the pattern information data from said central processing unit for generating a video signal in response to the picture data stored in the video RAM to thereby display a power spectrum by way of said pattern on the screen of the display unit such that said plural frequencies within said spectrum are arranged in sequence on the screen of the display unit.

17. A spectrum display device for an audio signal comprising:
 (a) band-separating means for dividing an input audio signal into several signals one for each of plural frequency bands;
 (b) analog-to-digital converting means for respectively converting a plurality of output signals derived from said band-separating means into digital signals at different sampling frequencies;
 (c) a plurality of central processing units for (i) effecting FFT operation in connection with the digital signals derived from said analog-to-digital converting means, (ii) effecting power spectrum calculation in connection with the result of the FFT operation to obtain power spectrum data, (iii) converting said power spectrum data into pattern information corresponding to amplitudes of a plurality of frequencies within a spectrum of said input audio signal, and (iv) deriving data indicative of said pattern information, one of said central processing units being arranged to effect FFT operation and power spectrum calculation in connection with the digital signals of a predetermined frequency band among said plurality of frequency bands, said plurality of central processing units being connected to be mutually responsive to each other so that given operations are performed with appropriate timing in each of said plurality of central processing units; and
 (d) a video display processor having a display unit with a screen and a video RAM for storing picture data, said display processor being supplied with the output data from said plurality of central processing units for generating a video signal using the picture data stored in the video RAM to thereby display a power spectrum by way of said pattern on the screen of the display unit such that said plurality of frequencies within said spectrum are arranged in sequence.

18. A spectrum display device for an audio signal comprising:
 (a) band-separating means for dividing an input audio signal into several signals one for each of plural frequency bands;
 (b) a plurality of analog-to-digital converting means for respectively simultaneously converting a plurality of output signals from said band-separating means into digital signals at different sampling frequencies;
 (c) a plurality of central processing units for (i) effecting FFT operation in connection with the digital signals derived from said plurality of analog-to-digital converting means, (ii) effecting power spectrum calculation in connection with the result of the FFT operation to obtain power spectrum data, (iii) converting said power spectrum data into pattern information corresponding to the amplitudes of plural frequencies within a spectrum of said input audio signal, and (iv) deriving data indicative of said pattern information, one of said central processing units being arranged to effect FFT operation and power spectrum calculation in connection with the digital signals of a predetermined frequency band among said plurality of frequency bands, said plurality of central processing units being connected to be mutually responsive to each other so that given operations are performed at appropriate timing in each of said plurality of central processing units; and
 (d) a video display processor having a display unit with a screen and a video RAM for storing picture data, said display processor being supplied with the output data from said plurality of central processing units for generating a video signal using the picture data stored in the video RAM to thereby display a power spectrum by way of said pattern on a screen of a display unit such that said plurality of frequencies within said spectrum are arranged in sequence.

19. Apparatus for processing an analog signal having a predetermined frequency range and converting said analog signal into a plurality of digital signals, each of said digital signals representing the amplitude of the analog signal in each of plural different bands in the predetermined frequency range, each of said ranges having a maximum frequency, comprising means responsive to the analog signal for separating said analog signal into the plural different bands whereby plural further analog signals, one for each of the bands, are derived, means for converting each of the plural further analog signals into a separate digital signal, said means for converting having a different sampling frequency associated with each of the plural further analog signals, the different sampling frequency for each of the plural further analog signals being arranged so that the sampling frequency increases with increasing maximum frequencies associated with each band, and digital signal processing means for processing the separate digital signals derived by the means for converting.

20. The apparatus of claim 19 wherein the digital signal processing means includes means for deriving an indication of the amplitude of the digital signal derived by the means for converting for each of the plural different bands.

21. The apparatus of claim 20 further including means responsive to the indication of each digital signal amplitude and an indication of the band associated therewith for displaying each of the amplitude indications as a discrete length along a first direction of an X-Y plot and for displaying the associated band at a different position along a second direction of the plot.

22. A method of displaying a spectrum of an audio signal comprising:
  (a) separating an input audio signal into a plurality of output signals one for each of plural frequency bands;
  (b) respectively converting the plurality of output signals into digital signals at different sampling frequencies;
  (c) activating plural central processing units to: (i) perform FFT operations on the converted digital signals, (ii) perform a power spectrum calculation on the results of the FFT operations to obtain power spectrum data, (iii) convert said power spectrum data into pattern information corresponding to amplitudes of plural frequencies within a spectrum of said input audio signal, and (iv) derive data indicative of said pattern information, one of said central processing units performing an FFT operation and power spectrum calculation in connection with the digital signal of a predetermined frequency band among said plurality of frequency bands, said plural central processing units being mutually responsive to each other so that given operations are performed with appropriate timing in each of said plural central processing units; and
  (d) activating a video display processor so it is supplied with the output data of said plural central processing units to generate a video signal using picture data stored in a video RAM to thereby display a power spectrum by way of said pattern on a screen of a display unit such that said plural frequencies within said spectrum are arranged in sequence.

23. A method of displaying a spectrum of an audio signal comprising:
  (a) separating an input audio signal into a plurality of output signals one for each of plural frequency bands;
  (b) respectively simultaneously converting the plurality of output signals into digital signals at different sampling frequencies;
  (c) activating plural central processing units to: (i) perform FFT operations on the converted digital signals, (ii) perform a power spectrum calculation on the result of the FFT operations to obtain power spectrum data, (iii) convert said power spectrum data into pattern information corresponding to the amplitudes of plural frequencies within a spectrum of said input audio signal, and (iv) derive data indicative of said pattern information, one of said central processing units performing an FFT operation and power spectrum calculation in connection with the digital signals of a predetermined frequency band among said plurality of frequency bands, said plural central processing units being mutually responsive to each other so that given operations are performed at appropriate timing in each of said plural central processing units; and
  (d) activating a video display processor so it is supplied with the output data of said plural central processing units to generate a video signal using picture data stored in a video RAM to thereby display a power spectrum by way of said pattern on a screen of a display unit such that said plural frequencies within said spectrum are arranged in sequence.

* * * * *